(12) United States Patent
Chen

(10) Patent No.: US 9,859,223 B2
(45) Date of Patent: Jan. 2, 2018

(54) DICING STRUCTURES FOR SEMICONDUCTOR SUBSTRATES AND METHODS OF FABRICATION THEREOF

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/792,449

(22) Filed: Jul. 6, 2015

(65) Prior Publication Data

US 2015/0311162 A1    Oct. 29, 2015

Related U.S. Application Data

(62) Division of application No. 12/716,512, filed on Mar. 3, 2010, now Pat. No. 9,076,798.

(60) Provisional application No. 61/177,034, filed on May 11, 2009.

(51) Int. Cl.
| | |
|---|---|
| H01L 21/00 | (2006.01) |
| H01L 23/544 | (2006.01) |
| H01L 21/78 | (2006.01) |
| H01L 23/58 | (2006.01) |
| H01L 21/3205 | (2006.01) |
| H01L 21/768 | (2006.01) |
| H01L 21/66 | (2006.01) |

(52) U.S. Cl.
CPC ...... *H01L 23/544* (2013.01); *H01L 21/32051* (2013.01); *H01L 21/76811* (2013.01); *H01L 21/76837* (2013.01); *H01L 21/78* (2013.01); *H01L 22/14* (2013.01); *H01L 22/20* (2013.01); *H01L 23/585* (2013.01); *H01L 2223/5446* (2013.01); *H01L 2223/54426* (2013.01); *H01L 2924/0002* (2013.01); *H01L 2924/19041* (2013.01); *H01L 2924/19042* (2013.01); *H01L 2924/19043* (2013.01); *H01L 2924/30105* (2013.01)

(58) Field of Classification Search
CPC .. H01L 23/544; H01L 21/78; H01L 21/76837
USPC .......................... 257/797, E23.179; 438/462
See application file for complete search history.

(56) References Cited

U.S. PATENT DOCUMENTS

| | | |
|---|---|---|
| 4,981,529 A | 1/1991 | Tsujita |
| 5,528,372 A | 6/1996 | Kawashima |
| 5,933,744 A | 8/1999 | Chen et al. |
| 6,555,925 B1 | 4/2003 | Higashi et al. |
| 6,617,669 B2 | 9/2003 | Saito |

(Continued)

*Primary Examiner* — Robert Huber
(74) *Attorney, Agent, or Firm* — Slater Matsil, LLP

(57) ABSTRACT

Dicing structures for semiconductor substrates and methods of fabrication thereof are described. In one embodiment, a semiconductor wafer includes a first chip disposed in a substrate, a second chip disposed adjacent the first chip and disposed in the substrate, and a dicing street disposed between the first and the second chip. A first and a second metal level are disposed over the dicing street, wherein the second metal level is disposed above the first metal level. A first alignment mark is disposed in the first metal level above a first portion of the dicing street, and first metal features disposed in the second metal level above the first portion of the dicing street.

20 Claims, 28 Drawing Sheets

(56) References Cited

U.S. PATENT DOCUMENTS 7,288,461 B2 10/2007 Chia et al.
2008/0106738 A1 5/2008 Kim

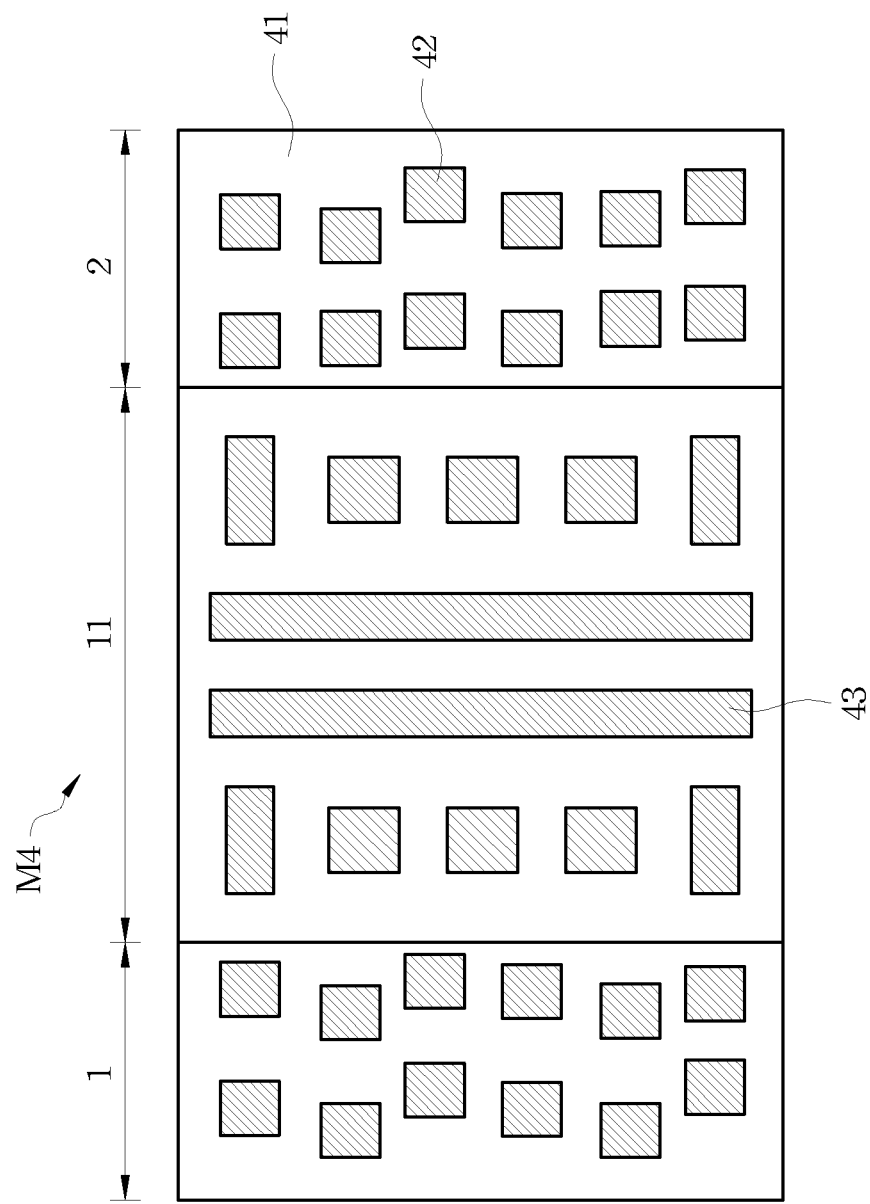

DICING STRUCTURES FOR SEMICONDUCTOR SUBSTRATES AND METHODS OF FABRICATION THEREOF

This application is a divisional of and claims priority to U.S. patent application Ser. No. 12/716,512, filed on Mar. 3, 2010, and entitled "Dicing Structures for Semiconductor Substrates and Methods of Fabrication Thereof" which claims the benefit of U.S. Provisional Application No. 61/177,034, entitled "Dicing Structures for Semiconductor Substrates and Methods of Fabrication Thereof," filed on May 11, 2009, which is incorporated herein by reference.

TECHNICAL FIELD

The present invention relates generally to semiconductor substrates, and more particularly to dicing structures for semiconductor structures and methods of fabrication thereof.

BACKGROUND

Semiconductor devices are used in many electronic and other applications. Semiconductor devices comprise integrated circuits that are formed on semiconductor wafers by depositing many types of thin films of material over the semiconductor wafers and patterning the thin films of material to form the integrated circuits.

Metallization layers are usually the top-most layers of semiconductor devices. While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also referred to as an inter-level dielectric (ILD). Advanced semiconductor processes utilize inter-level dielectrics with low dielectric constants (k) and/or ultra-low dielectric constants (ULK) to minimize interconnect parasitic capacitances.

One of the challenges in semiconductor technology requires developing technologies with good product yield and reliability. However, with low dielectric constants, materials have poor mechanical properties. Consequently, use of low-k and ultra-low dielectric constant materials introduces additional challenges in maintaining yield and component reliability.

Thus, what is needed in the art are semiconductor components containing low-k and ultra-low dielectric constant materials but without comprising product yield or component reliability.

SUMMARY OF THE INVENTION

These and other problems are generally solved or circumvented, and technical advantages are generally achieved, by preferred embodiments of the present invention.

Embodiments of the invention include dicing structures for semiconductor substrates. In accordance with an embodiment of the present invention, a semiconductor wafer comprises a first chip disposed in a substrate, a second chip disposed adjacent the first chip and disposed in the substrate, and a dicing street disposed between the first and the second chip. A first and a second metal level are disposed over the dicing street, wherein the second metal level is disposed above the first metal level. A first alignment mark is disposed in the first metal level above a first portion of the dicing street, and first metal features disposed in the second metal level above the first portion of the dicing street.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1f, illustrates a dicing street disposed between multiple chips on a semiconductor wafer in accordance with an embodiment of the invention, wherein FIG. 1a illustrates a top view, FIG. 1b is a cross-sectional view of the semiconductor around a dicing street, wherein FIGS. 1c-1e illustrate top cross-sectional views of metal lines within a metallization level in the dicing street, and wherein FIG. 1f is a cross-sectional view of the semiconductor along a dicing street;

FIG. 3, which includes FIGS. 3a-3c, illustrates a metallization layer above the alignment mark, in accordance with embodiments of the invention;

FIG. 7, which includes

FIG. 8, which includes

FIG. 10, which includes FIG. 11, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
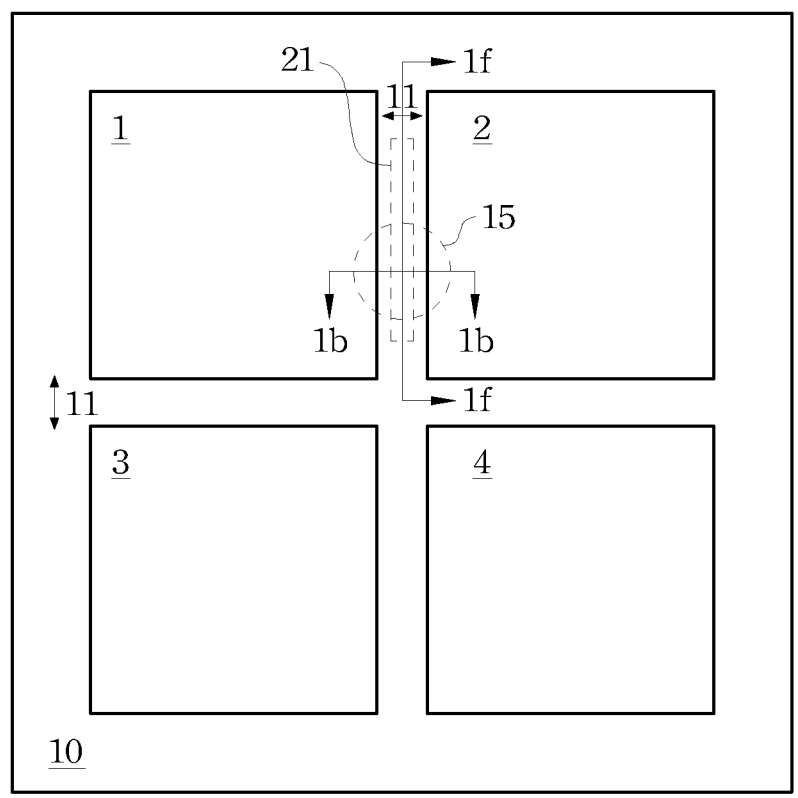

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely to structures within dicing regions of a semiconductor substrate. The invention may also be applied, however, to other types of structures outside the dicing regions, for example, to improve mechanical reliability.

Low-k dielectric materials are used to lower parasitic interconnect capacitances in BEOL or metallization levels. Recent and future technology will likely introduce further lower dielectric constant materials such as ultra low-k dielectric materials. However, the introduction of such materials introduces a number of challenges. For example, low-k materials typically comprise poor mechanical properties. Further, adhesion of these low-k dielectric material layers to adjacent dielectric layers and metal layers is poor. Consequently, low-k dielectric layers are prone to cracks and/or delaminations. Such failure can arise either during processing or during operation of the chip. For example, after the deposition of these low-k dielectric material layers, cracks may develop during subsequent processing of the semiconductor wafer.

A significant source of cracks arises from the corners and the edges of the chips either from stress concentrations in the edges or from other mechanical impact. For example, stresses induced in the edge of the chip during wafer dicing may create micro-cracks and propagate rapidly through the dielectric layers. One way to minimize such micro-crack propagation is the use of a crack-stop structure. The crack-stop structure is a metal wall (a combination of metal lines and vias over many metallization levels) introduced around the periphery of a chip. However, crack stop structures do not ensure complete immunity. For example, large cracks may possess sufficient energy to delaminate the crack stop structure or to break through weak spots in the crack stop structures.

In various embodiments, the present invention prevents crack propagation during wafer dicing by introducing additional features within the region used for dicing. Additional structures added to the dicing region may interfere with alignment mark detection units necessary to align the wafer correctly with a dicing tool. However, in various embodiments, the invention overcomes these limitations by the selective use of additional features to minimize aligning errors during dicing.

A structural embodiment of a dicing street for separating multiple chips fabricated on a semiconductor substrate is described using FIG. 1. Further structural embodiments of the dicing street will be described with respect to FIGS. 2-8. A method of designing the dicing street will be described in FIGS. 9 and 10. A method of fabricating the dicing street in accordance with embodiments of the invention will be described using FIG. 11.

Figure 1B:
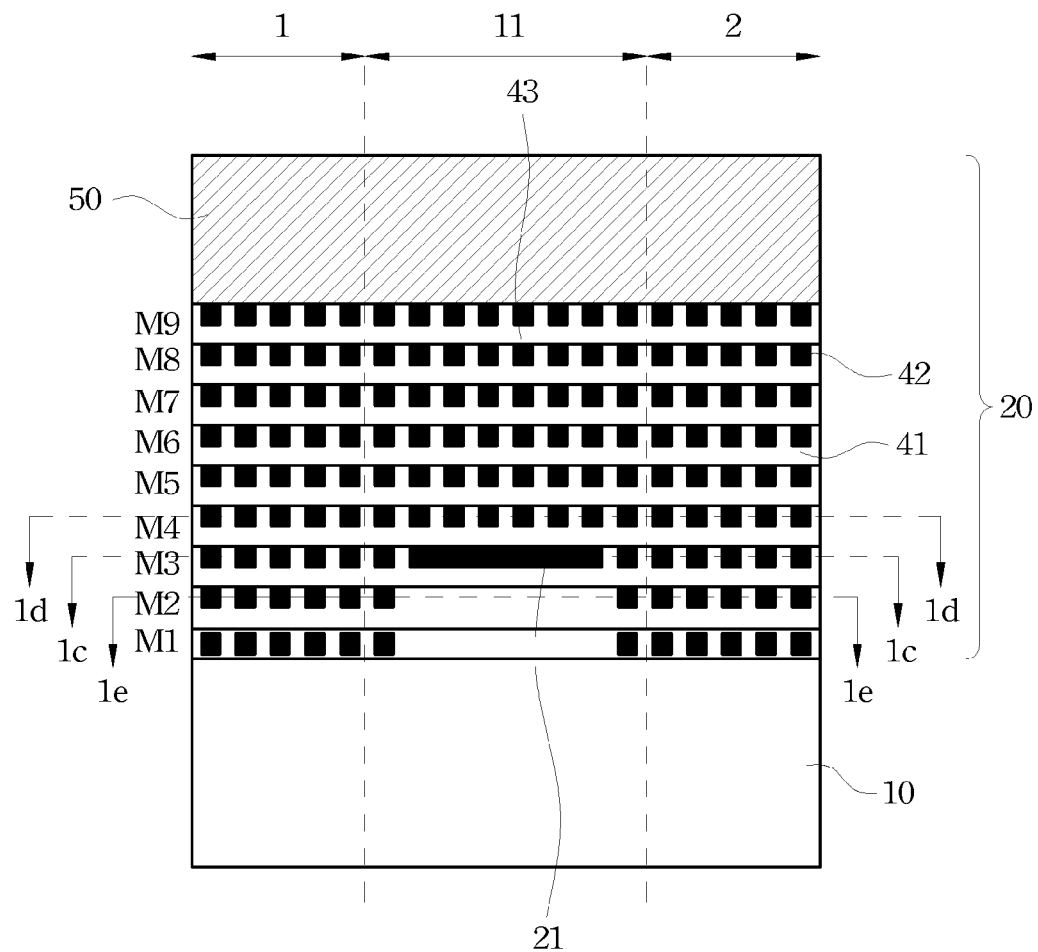
Figure 1C:
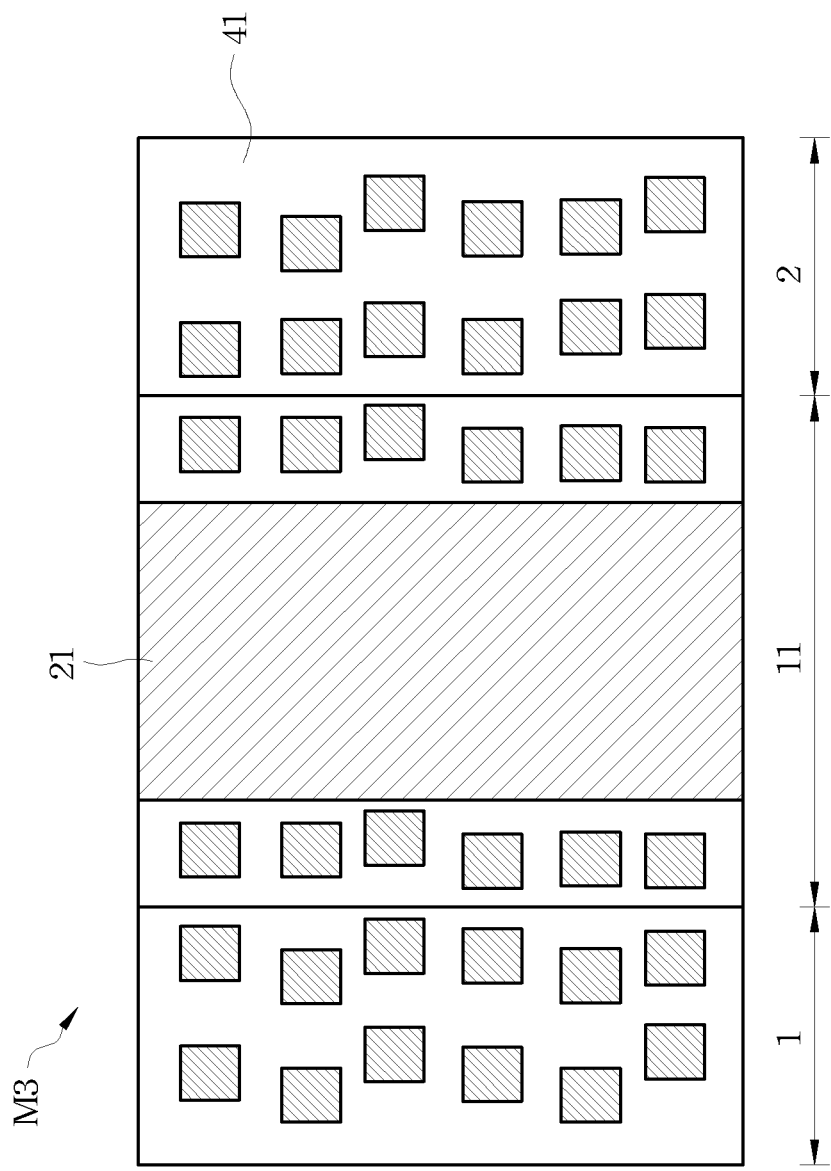
Figure 1D:
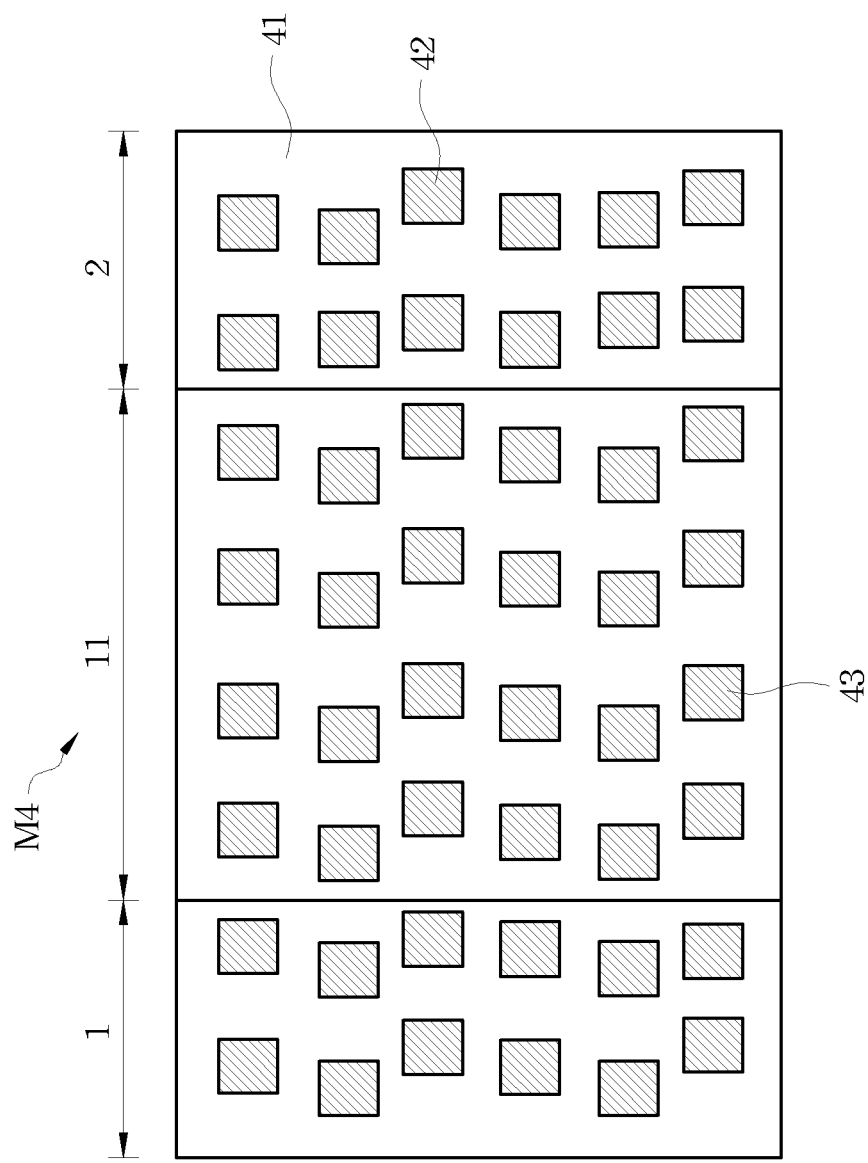
Figure 1E:
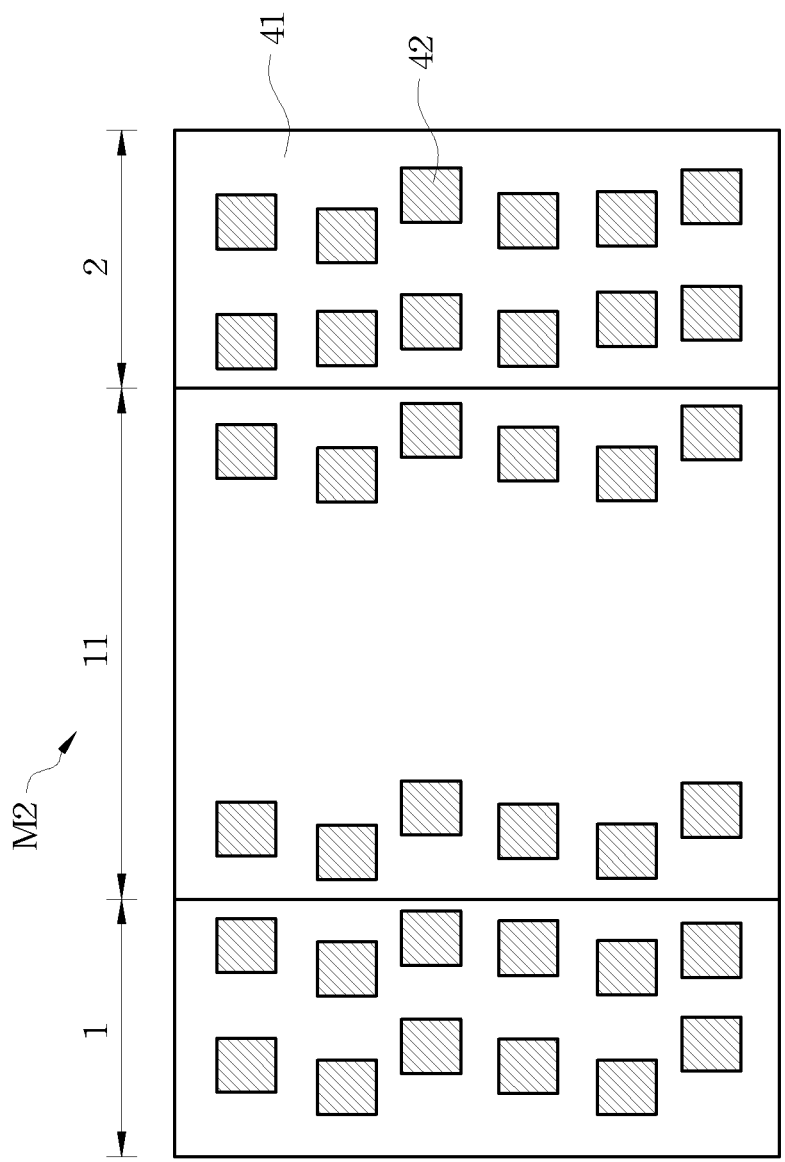
Figure 1F:
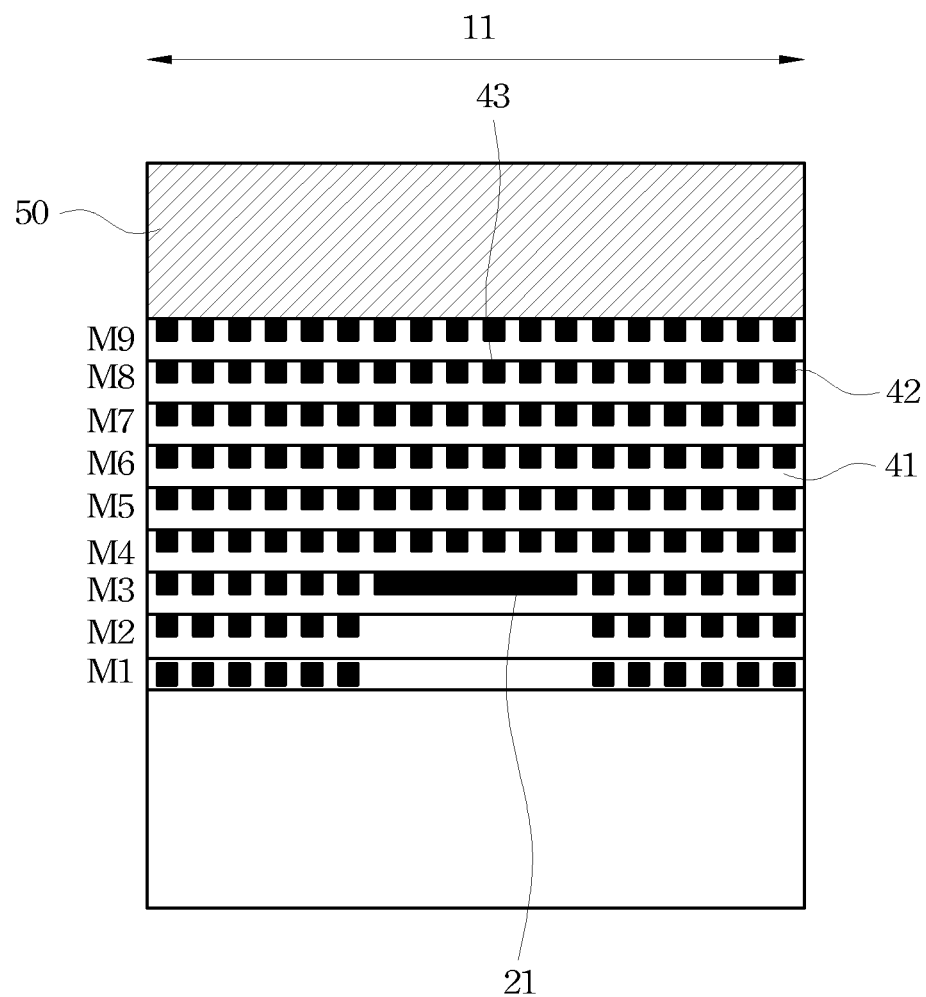

FIG. 1, which includes FIGS. 1*a*-1*f,* illustrates a semiconductor wafer after fabrication of individual chips but before dicing, in accordance with embodiments of the invention. FIG. 1*a* illustrates a top view of the semiconductor wafer and illustrates multiple chips separated by dicing streets. FIG. 1*b* is a cross-sectional view of the semiconductor around a dicing street. FIGS. 1*c*-1*e* illustrate top cross-sectional views of metal lines within a metallization level, wherein FIG. 1*c* illustrates the metal lines in a metal level comprising the alignment mark, wherein FIG. 1*d* illustrates the metal lines in a metal level above the alignment mark, and wherein FIG. 1*e* illustrates the metal lines in a metal level below the alignment mark. FIG. 1*f* is a cross-sectional view of the semiconductor along a dicing street.

FIG. 1*a* illustrates a top view of a semiconductor wafer comprising a first chip 1, a second chip 2, a third chip 3, and a fourth chip 4 disposed in a substrate 10. The substrate 10 comprises active devices forming the active circuitry of each of the semiconductor chip. The active circuitry contains the active device regions and includes necessary transistors, resistors, capacitors, inductors or other components used to form integrated circuits. For example, active areas that include transistors (e.g., CMOS transistors) can be separated from one another by isolation regions, e.g., shallow trench isolations.

Each of the chips on the substrate 10 comprises metallization levels formed over the active device regions to electrically contact and interconnect the active devices. The metallization and active device regions together form a completed functional integrated circuit. In other words, the electrical functions of the first, the second, the third, and the fourth chips 1-4 can be performed by the interconnected active circuitry.

The first, the second, the third, and the fourth chips 1-4 are separated by dicing streets 11. The dicing streets 11 comprise alignment marks 21 for dicing as well as other structures such as test and monitoring structures. Dicing streets 11 are typically about 10 µm to about 300 µm wide. The first, the second, the third, and the fourth chips 1-4 are surrounded by crack stop structures (not shown) that prevent cracks from propagating from the dicing street 11 into the first, the second, the third, and the fourth chips 1-4.

FIG. 1*b* illustrates a vertical cross-section (line 1*b*-1*b* of FIG. 1*a*) of a portion of the wafer 15 (ellipse) illustrated in FIG. 1*a*. While only the dicing street 11 between the first and the second chips 1 and 2 is illustrated in FIG. 1*b*, other dicing streets between other chips (for example, between the third and the fourth chips 3 and 4) are similar. FIG. 1*b* illustrates the edge of the first and the second chips 1 and 2. The edge of the first and the second chips 1 and 2 may include structures such as a crack stop structure (not shown), as well as other structures such as a moisture barrier.

As illustrated in FIG. 1*b*, a back end of the line (BEOL) layer 20 is disposed above the substrate 10. The BEOL layer comprises the metal levels and corresponding via levels. The metal lines connect the various active devices on the chip, whereas the vias connect the different metal levels. In various embodiments, the metal lines and vias comprise an inner metal core and an outer metal liner. The inner metal core comprises copper, although other metals may also be used in some embodiments. In some embodiments, the metal lines comprise tungsten and/or aluminum. The outer metal liner comprises a barrier metal such as TiN or TaN (or any other suitable metal liner materials).

Each metal level comprises metal lines embedded in an inter-level dielectric layer 41. The BEOL layer 20 comprises multiple layers of the inter-level dielectric layer 41. The inter-level dielectric layer 41 comprises a low-k dielectric material such as a material selected from the group comprising fluorinated silicate glass (FSG), carbon doped glass, organo silicate glass (OSG), hydrogen doped glass, porous carbon doped glass, porous silicon dioxide, polymeric dielectrics, F-doped amorphous carbon, silicone based polymeric dielectrics such as hydrogen silsesquioxane (HSQ) and methylsilsesquioxane (MSQ). In some embodiments, the inter-level dielectric layer 41 comprises ultra low-k materials such as porous silicate glass, xerogel, aerogel, nano clustered silica (NCS), porous organo silicate glass, and porous organics. In some embodiments, the top layers of the inter-level dielectric layer 41 comprises a higher-k dielectric such as SiO2 or FSG. The interconnect stack in the BEOL layers 20 may comprise any combination of the above dielectric materials.

In various embodiments, the BEOL layer 20 comprises multiple layers of the inter-level dielectric layer 41 separated by etch stop liners. The etch stop liners comprise a material comprising SiCHN although, in other embodiments, other nitrides or other suitable materials may be used. Examples of etch stop liners include materials such as silicon nitride (SiN), silicon oxynitride (SiON), silicon carbide (SiC) or silicon carbo nitride (SiCN).

In various embodiments, the BEOL layers 20 are covered by a passivation layer 50, and may comprise additional features for contacting the upper metallization levels. For example, contact pads are disposed in the passivation layer 50 to electrically contact the metallization levels. In logic devices, the metallization may include many layers, e.g., nine or more, of copper or alternatively of other metals. In memory devices, such as DRAMs, the number of metal levels may be less and they may comprise aluminum metal lines.

The dicing street comprises an alignment mark 21. For example, in one embodiment, the alignment mark 21 is disposed in the third metal level M3. However, in other embodiments, the alignment mark 21 is disposed in other metal levels. Alignment marks are used for aligning the substrate 10, for example, the wafer with a dicing tool. An interferometer may be used to detect the alignment mark 21, using for example, a difference in contrast between the alignment mark 21 and the background substrate 10.

In various embodiments, the dicing street 11 also comprises metal lines. As illustrated in FIG. 1b, the metal levels disposed above the alignment mark 21 comprise metal lines, whereas a metal level disposed immediately below the alignment mark 21 does not comprise any metal lines. In some embodiments, all metal levels below the alignment mark 21 do not comprise any metal lines.

Metal lines disposed in metal levels above the alignment mark 21 do not significantly produce an erroneous reading during the alignment process. In contrast, metal lines disposed in metal levels below the alignment mark 21 produce an erroneous reading during the alignment process. Hence, in various embodiments, the invention minimizes errors in aligning the substrate by not including metal levels immediately below the alignment mark. In various embodiments, the mechanical properties of the BEOL layer 20 above the dicing street is significantly improved by including metal lines above the alignment mark 21. The improved mechanical strength minimizes crack propagation or delamination, while minimizing misalignment errors.

FIGS. 1c-1e illustrate top cross-sectional views of the dicing street illustrating metal lines. Referring to FIG. 1c, the third metal level M3 within the dicing street 11 comprises an alignment mark 21. The alignment mark 21 is disposed in the inter-level dielectric layer 41.

FIG. 1d illustrates the metal level (fourth metal level M4) immediately above the alignment mark 21. The fourth metal level M4 disposed within the first or second chips 1 or 2 comprises first metal features 42, whereas the fourth metal level M4 disposed within the dicing street 11 comprises second metal features 43. The first metal features 42 include metal lines coupling active devices as well as metal lines used in forming capacitor, crack stop or moisture barrier structures.

In various embodiments, the first metal features 42 and the second metal features 43 comprise the same material layers. However, the shapes and sizes of the first metal features 42 and the second metal features 43 may be different. Similarly, the areal density of the second metal features 43 may be different than the first metal features 42. In one embodiment, the second metal features 43 comprise a square shape, whereas on other embodiments, any suitable shape such as circular, elliptical, or rectangular shape may be used.

FIG. 1e illustrates the metal level (second metal level M2) immediately below the alignment mark 21. The second metal level M2 disposed within the first or second chips 1 or 2 comprise first metal features 42. Unlike the fourth metal level M4, the second metal level M2 disposed within the dicing street 11 does not comprise any metal features. The absence of metal lines below the alignment mark minimizes photo interference noise when aligning the substrate 10 with a dicing tool.

FIG. 1f illustrates a vertical cross-section (line 1f-1f of FIG. 1a) along the dicing street 11. As illustrated in FIG. 1f, the metal levels disposed above the alignment mark 21 comprise metal lines, whereas a metal level disposed immediately below the alignment mark 21 does not comprise any metal lines. In the illustrated embodiment, all metal levels below the alignment mark 21 do not comprise any metal lines.

Figure 2:
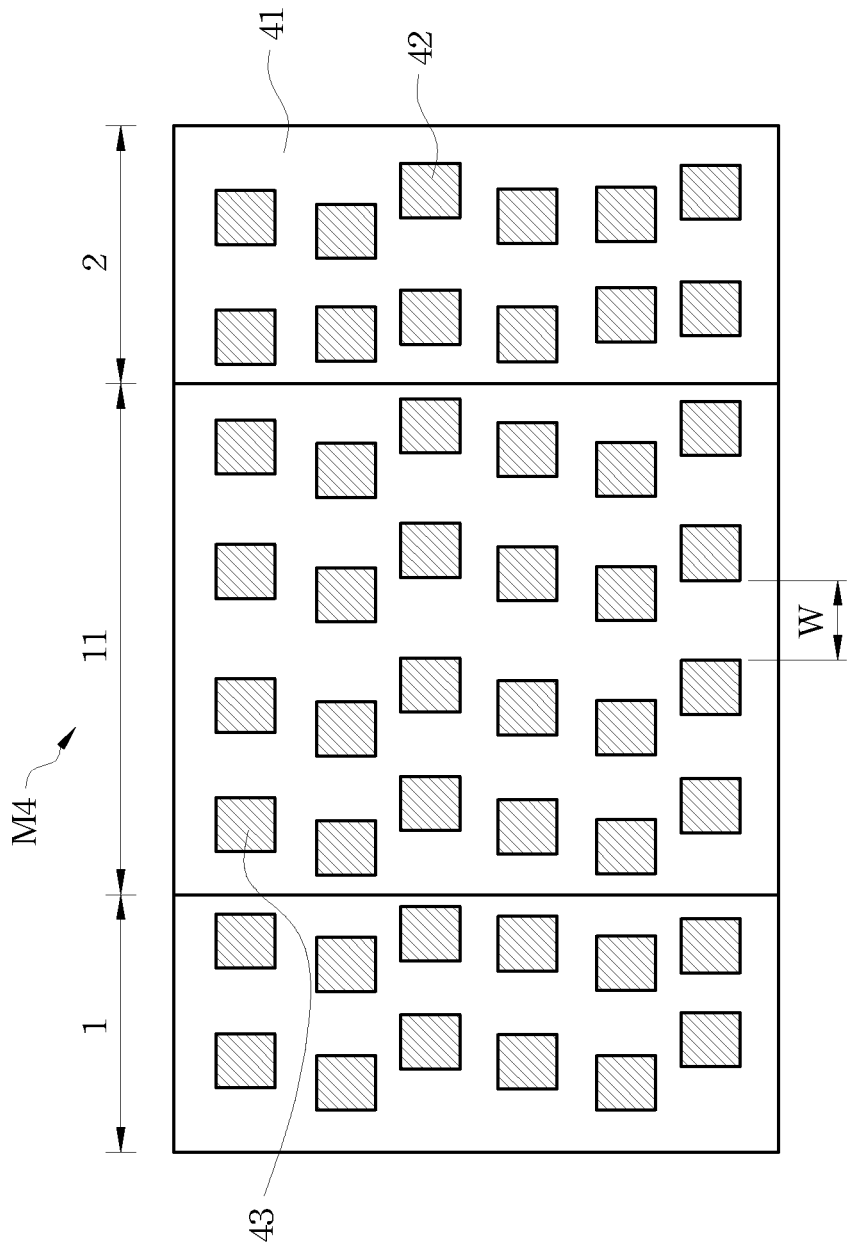
FIG. 2 illustrates a top cross-sectional view of a metal level within a dicing street, the metal level disposed immediately above a metal level comprising the alignment mark, in accordance with an embodiment of the invention.

FIG. 2 illustrates a top cross-sectional view of a metal level within a dicing street disposed immediately above a metal level comprising the alignment mark, in accordance with an embodiment of the invention.

FIG. 2 illustrates an embodiment in which the layer above the alignment mark comprises metal features that are optimized to minimize crack generation and/or propagation. The total surface area of the second metal feature 43 is determined by the total number of second metal features 43 and the area of each of the second metal features 43. The distance W between the second metal features 43 along with the total surface area of the second metal features 43 determines the metal density (ratio of the total surface area of the second metal features 43 to the total surface area of the metal level). As the metal density increases towards about 100% or decreases towards about 0%, the tendency to form micro-cracks and/or delaminate increases during dicing. In various embodiments, this metal density is about 20% to about 50%, and about 30% to about 40% in one embodiment. Referring to FIG. 2, the second metal features comprise a square shaped metal line.

Figure 3A:
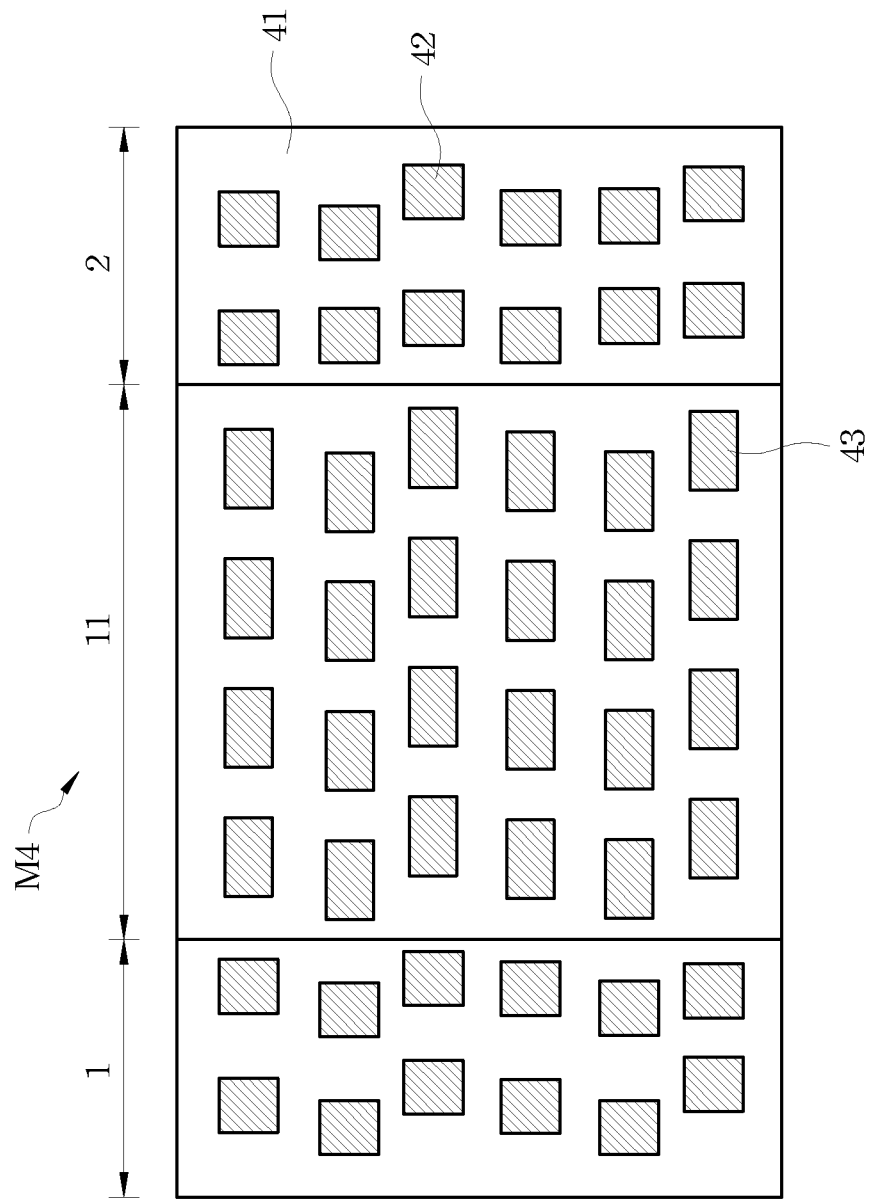
Figure 3B:
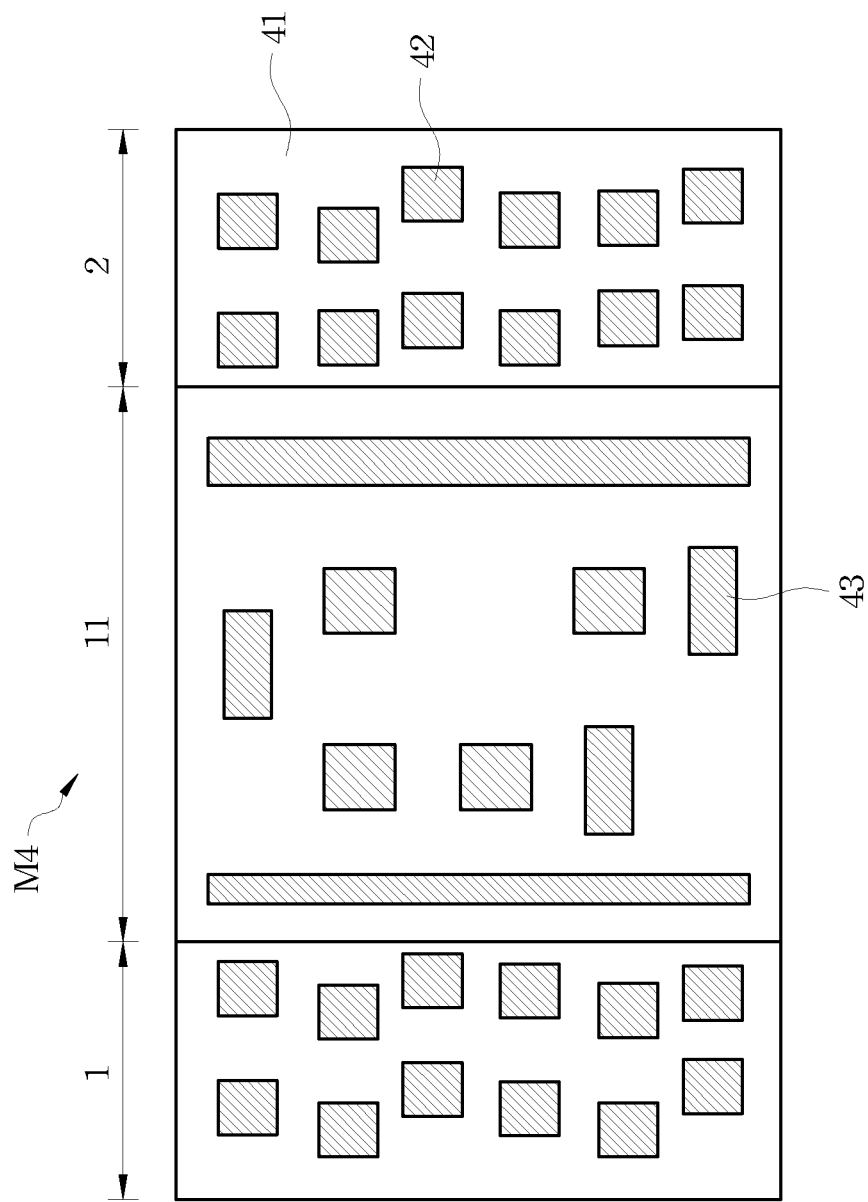

FIG. 3, which includes FIGS. 3a-3c, illustrates a metallization layer above the alignment mark, in accordance with embodiments of the invention.

Referring to FIG. 3a, second metal features 43 comprising metal lines are disposed in the layer above the alignment mark. Unlike the prior embodiment, the second metal features 43 in this embodiment comprise rectangular lines disposed within an inter-level dielectric layer 41.

FIG. 3b illustrates an alternative embodiment, wherein the second metal features 43 comprise different shapes and are spaced in a pattern. In one embodiment, the rectangular line like features of the second metal features 43 are placed along the periphery of the dicing street whereas the smaller second metal features 43 are placed towards the central region of the dicing street. FIG. 3c illustrates an alternative embodiment, wherein line shaped second metal features 43 are placed centrally while smaller second metal features 43 are placed towards the periphery of the dicing street. The embodiments of FIG. 3b or 3c may be experimentally chosen and may depend on the inter-level dielectric layer 41 as well as the type of the dicing tool. Further, subsequent metal levels may have second metal features 43 arranged in a different pattern.

Figure 4:
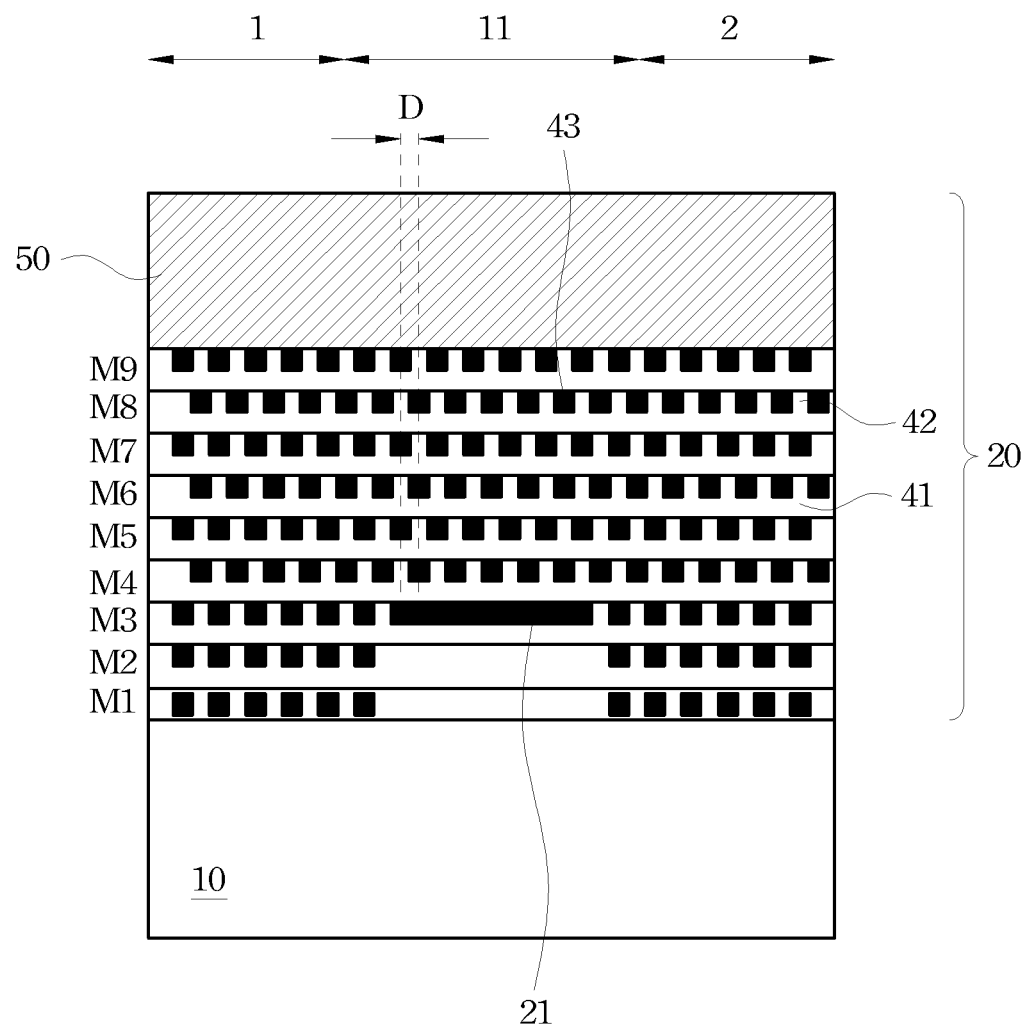
FIG. 4 illustrates a cross-sectional view of a dicing street in accordance with an embodiment of the invention, wherein the metal features disposed above the alignment mark are staggered between the metal levels.

FIG. 4 illustrates a cross-sectional view of a dicing street in accordance with an embodiment of the invention, wherein the metal features disposed above the alignment mark are staggered between the metal levels.

As also illustrated in FIG. 1b, a BEOL layer 20 is disposed above the substrate 10. The BEOL layer 20 comprises the metal levels and corresponding via levels. An alignment mark 21 is disposed within the BEOL layer 20. The metal levels disposed above the alignment mark 21 comprise metal lines, whereas metal levels disposed below the alignment mark 21 do not comprise any metal lines.

Referring to FIG. 4, the metal level disposed immediately above any metal level is staggered. For example, second metal features 43 in the fourth metal level M4 are displaced laterally by a distance D (staggered) relative to second metal features 43 in the fifth metal level M5. Second metal features 43 in the sixth metal level M6 are also displaced laterally relative to the second metal features 43 in the fifth metal level M5. Hence, second metal features 43 in the fourth metal level M4 and the sixth metal level M6 are positioned above each other. Similarly, second metal features 43 in the fifth metal level M5 are disposed below the second metal features 43 in the seventh and ninth metal levels M7 and M9.

Figure 5:
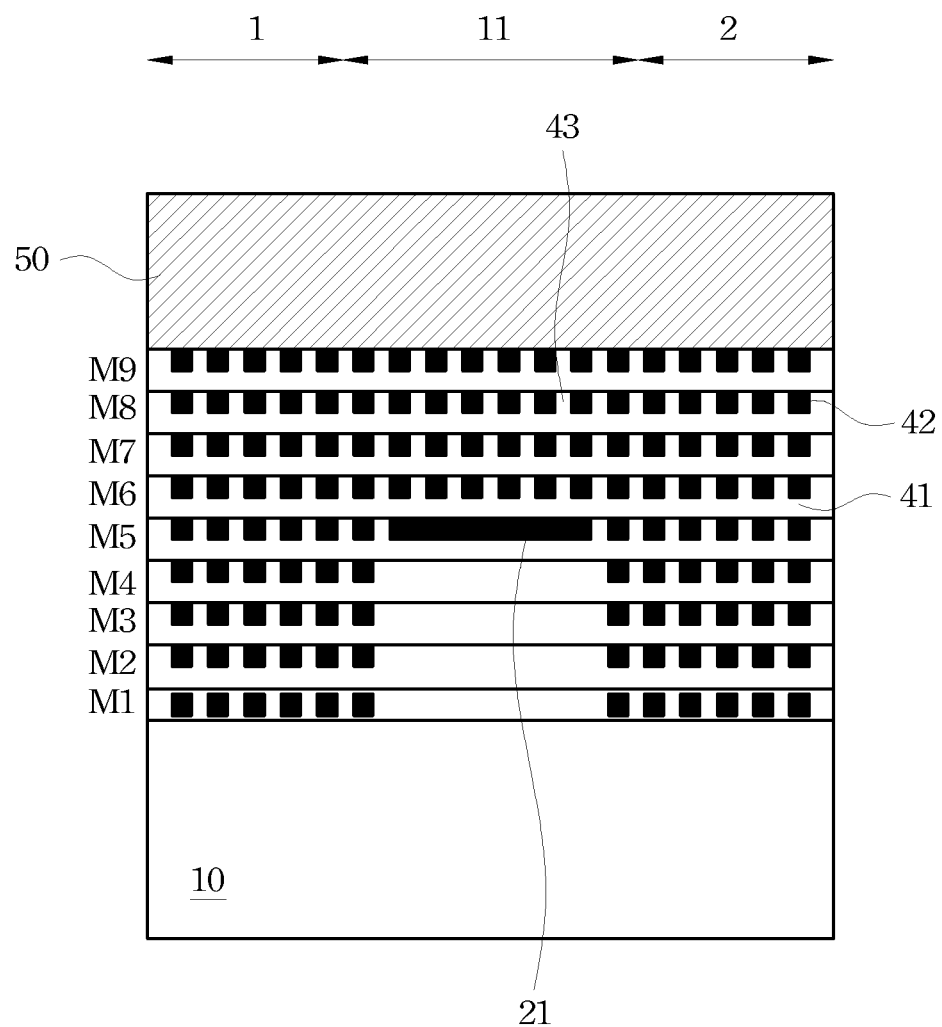
FIG. 5 illustrates an alternative embodiment wherein the alignment mark is disposed in the fifth metal level M5.

FIG. 5 illustrates an alternative embodiment wherein the alignment mark 21 is disposed in the fifth metal level M5. Metal levels above the alignment mark 21 comprise second metal features 43. Hence, sixth, seventh, eighth, and ninth metal levels M6, M7, M8 and M9 include the second metal features 43. However, metal levels below the alignment mark 21 do not include the second metal features 43.

Figure 6:
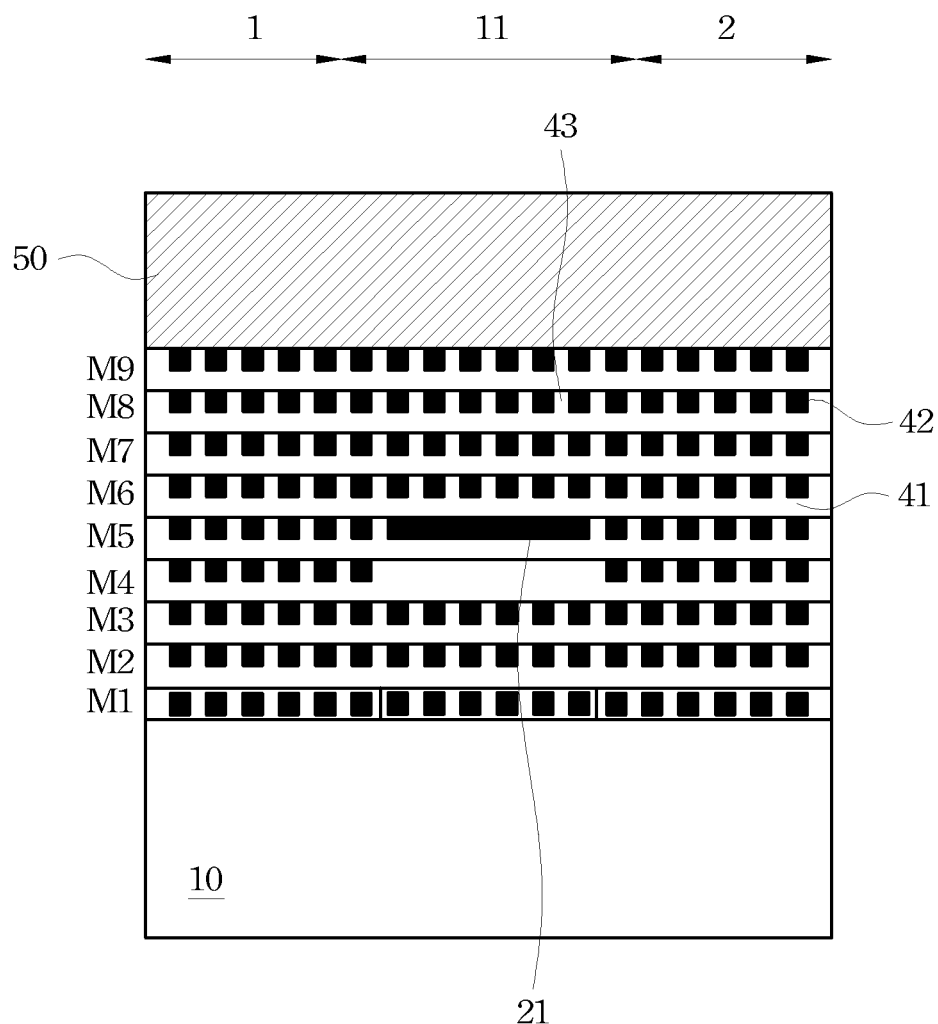
FIG. 6 illustrates an alternative embodiment wherein the alignment mark is disposed in the fifth metal level M5, wherein at least some of the metal levels below the alignment mark comprise metal features.

FIG. 6 illustrates an alternative embodiment wherein the alignment mark 21 is disposed in the fifth metal level M5, wherein at least some of the metal levels below the alignment mark 21 comprise metal features. As in the prior embodiment, metal levels above the alignment mark 21 comprise second metal features 43. Hence, sixth, seventh, eighth, and ninth metal levels M6, M7, M8 and M9 include the second metal features 43. However, unlike the prior embodiment, some of the metal levels below the alignment mark 21 include the second metal features 43. In particular, the fourth metal level M4 which is immediately below the alignment mark 21 does not include second metal features 43, whereas metal levels much below the alignment mark, e.g., first metal level M1 includes the second metal features 43. This is possible because the metal level immediately underneath the alignment mark introduces the most interference noise during the aligning process. The noise generated from lower metal levels decreases with distance from the alignment mark 21. Hence, the lowest metal level may include second metal features 43.

FIG. 7, which includes FIGS. 7a-7d, illustrates an embodiment of the invention wherein the alignment mark is formed in multiple metal levels.

Figure 7A:
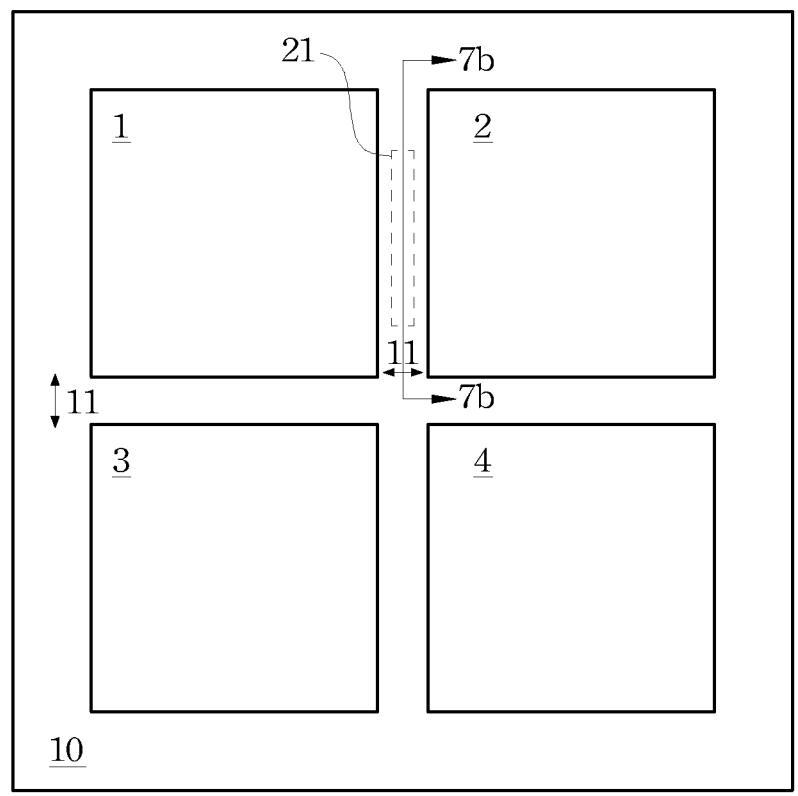
FIGS. 7a-7d, illustrates an embodiment of the invention wherein the alignment mark is formed in multiple metal levels.
Figure 7B:
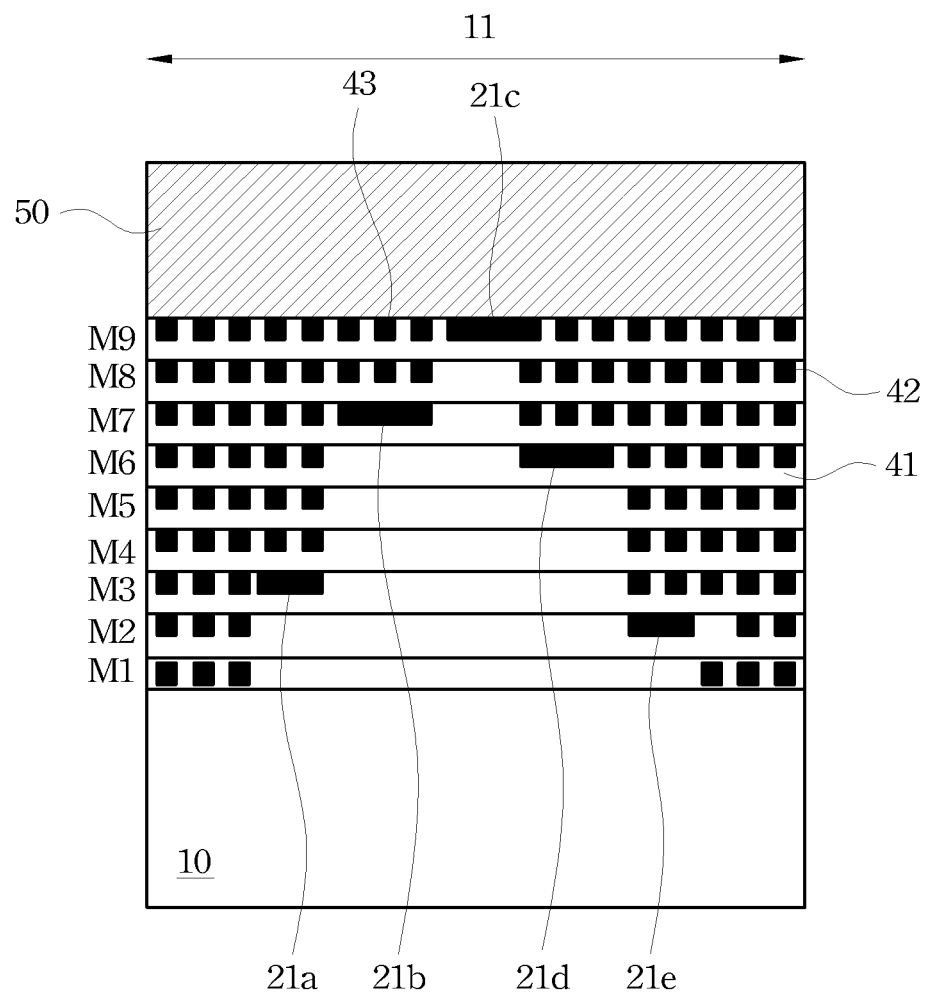

FIG. 7a illustrates a top view of a semiconductor wafer comprising a first chip 1, a second chip 2, a third chip 3, and a fourth chip 4 disposed in a substrate 10 (as described in FIG. 1a). The first, the second, the third, and the fourth chips 1-4 are separated by dicing streets 11, which include alignment mark 21. As illustrated in FIG. 7a, the alignment mark 21 has four corners or edges, two of which are parallel to the perimeter of the first and the second chip, while two of the corners are perpendicular to the perimeter of the first and the second chip. The cross-sectional view of the dicing street 11 along the line 7b-7b is illustrated in FIG. 7b. The alignment marks 21 include a first alignment mark 21a, a second alignment mark 21b, a third alignment mark 21c, a fourth alignment mark 21d, and a fifth alignment mark 21e.

Referring to FIG. 7b, the first alignment mark 21a is disposed in the third metal level, the second alignment mark 21b is disposed in the seventh metal level, the third alignment mark 21c is disposed in the ninth metal level, the fourth alignment mark 21d is disposed in the sixth metal level, and the fifth alignment mark 21e is disposed in the second metal level. As illustrated in FIG. 7b, second metal features 43 are disposed above the alignment marks 21 but not below the alignment marks 21. Further, portions of the alignment marks disposed in the upper metal levels are centrally placed enabling portions of the first alignment mark 21 disposed in the lower metal levels to be placed along the edges. For example, third alignment mark 21c is towards the inner region of the dicing street 11, whereas the first and the fifth alignment marks 21a and 21e are placed along the edges of the dicing street 11.

Alignment marks 21 disposed in the lower metal levels, e.g., the first and the fifth alignment marks 21a and 21e, provide better protection to crack propagation and initiation because of the larger metal density. Alignment marks disposed in the upper metal levels, e.g., the third alignment mark 21c, provide minimal protection to crack nucleation or propagation. In various embodiments, weaker portions of the alignment marks are formed centrally and the stronger portions of the alignment mark are formed along the corners of the dicing street 11.

Figure 7C:
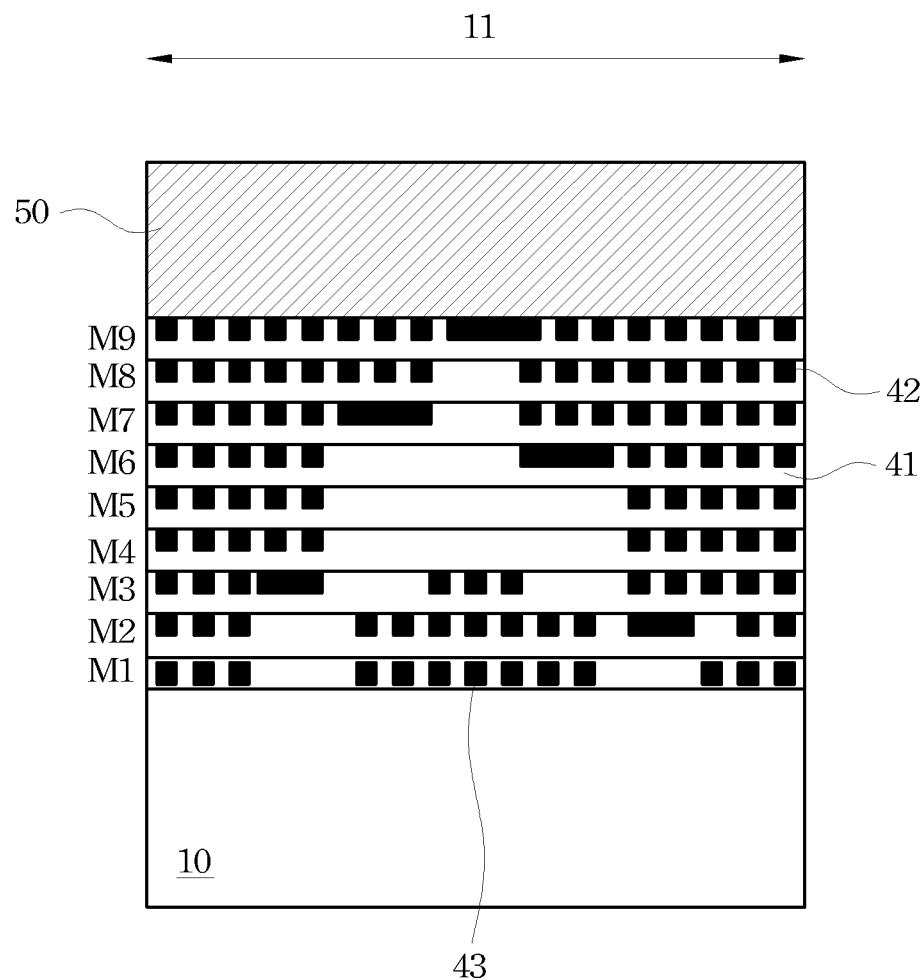

FIG. 7c illustrates an alternative embodiment of the alignment mark described in FIG. 7b. However, unlike the prior embodiment, at least some of the lower metal levels underneath some of the alignment marks comprise secondary metal features 43. In one embodiment, for each alignment mark only a few metal levels below it are empty. For example, in FIG. 7c, for the third alignment mark 21c, the lower metal levels in the fourth, fifth, sixth, seventh, and eighth metal levels M4, M5, M6, M7, and M8 do not comprise secondary metal features 43, while the first, second, and third metal levels M1, M2, and M3 comprise secondary metal features 43. While in this embodiment, five alignment marks are shown, in different embodiments, more or fewer alignment marks may be used. Further, all the alignment marks may not share a same cross-sectional plane in some embodiments.

Figure 7D:
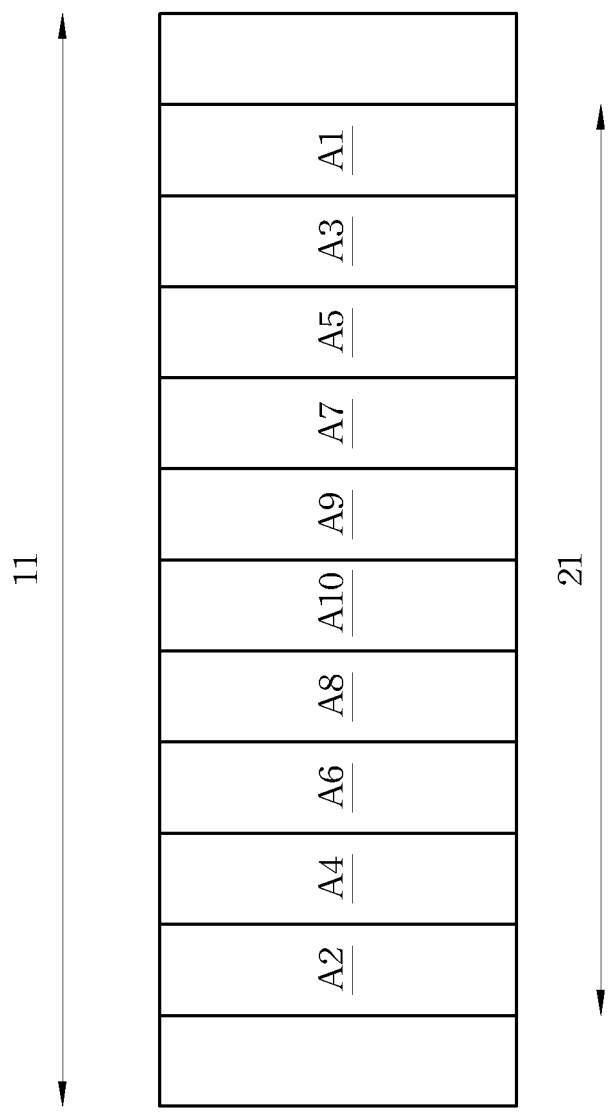

FIG. 7d illustrates a top view of a dicing street comprising alignment marks disposed in multiple metal levels in accordance with an embodiment of the invention. As illustrated in FIG. 7d, the dicing street 11 (along line 7b-7b of FIG. 7a) comprises a first alignment mark A1, a second alignment mark A2, a third alignment mark A3, a fourth alignment mark A4, a fifth alignment mark A5, a sixth alignment mark A6, a seventh alignment mark A7, an eighth alignment mark A8, a ninth alignment mark A9, and a tenth alignment mark A10 disposed in a first metal level, a second metal level, a third metal level, a fourth metal level, a fifth metal level, a sixth metal level, a seventh metal level, an eighth metal level, a ninth metal level, and a tenth metal level, respectively. The first, second, third, fourth, fifth, sixth, seventh, eighth, ninth, and tenth alignment marks A1-A10 are formed as in prior embodiments. Hence, the first alignment mark A1 has one of the highest metal density, while the tenth alignment mark A10 has the lowest metal density amongst the alignment marks.

As illustrated in FIG. 7d, the first and the second alignment marks A1 and A2 are disposed along the edges of the dicing street 11, whereas the eighth, the ninth, and the tenth alignment marks A8, A9 and A10 are disposed centrally. Hence, alignment marks with lower density of second metal features 43 are disposed centrally, while alignment marks with higher density of second metal features 43 are disposed along the corners of the dicing street 11.

FIG. 8, which includes FIGS. 8a-8d, illustrates an embodiment of the invention wherein the alignment mark is formed in multiple metal levels.

Figure 8A:
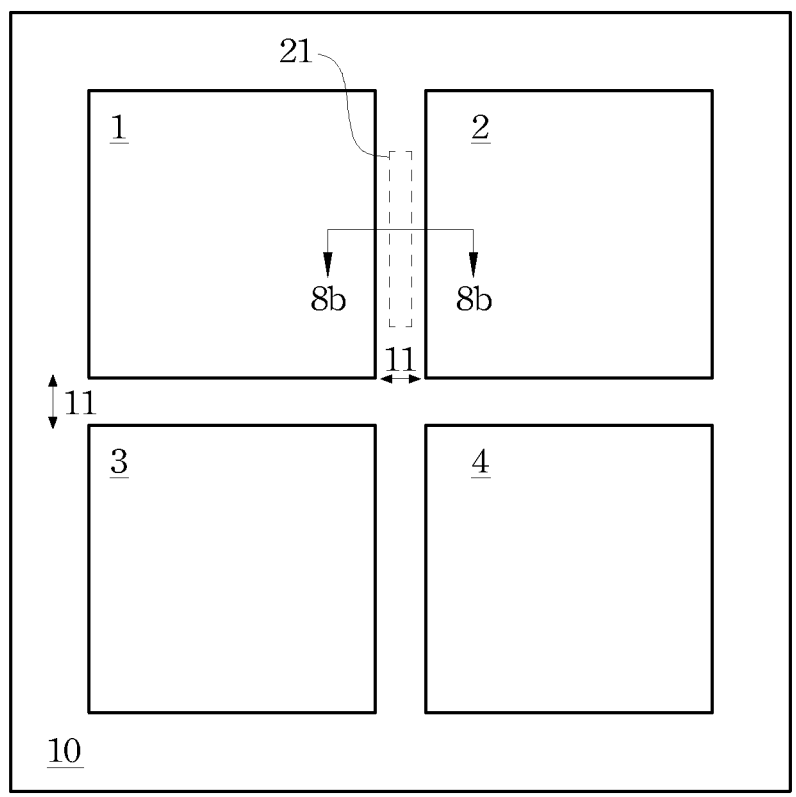
FIGS. 8a-8d, illustrates an embodiment of the invention wherein the alignment mark is formed in multiple metal levels.
Figure 8B:
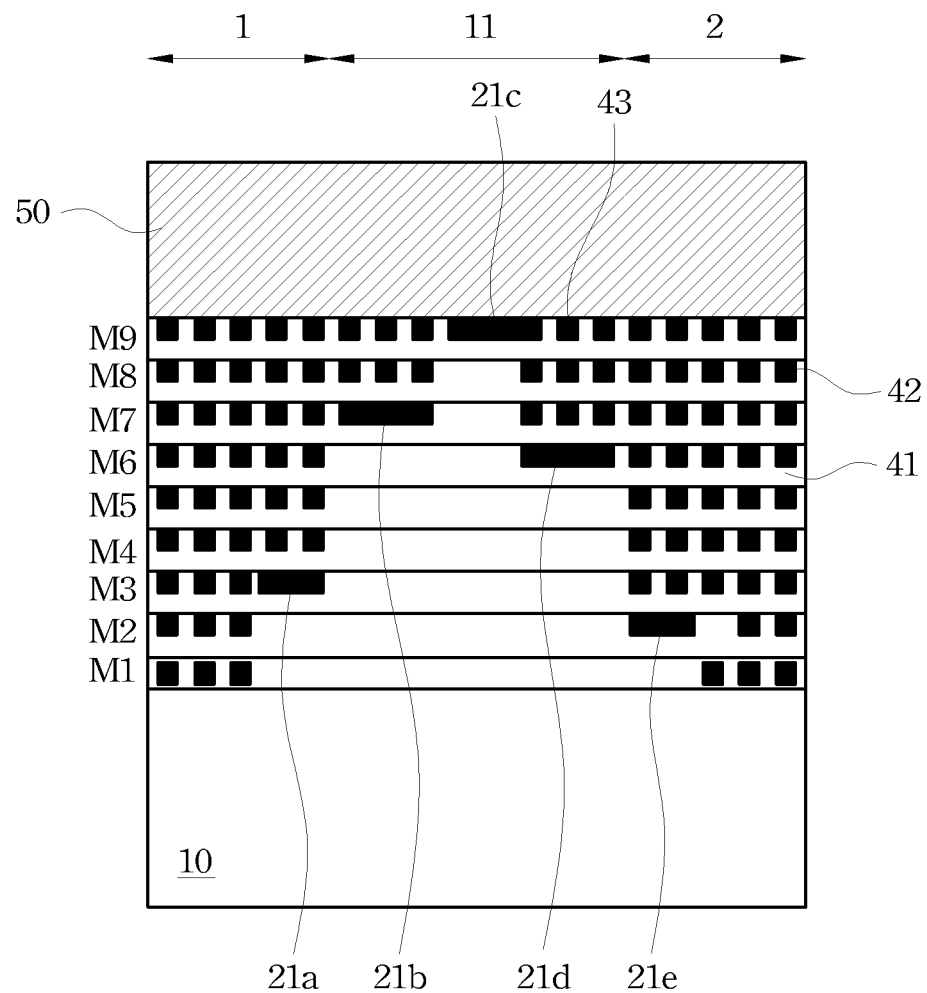
Figure 8C:
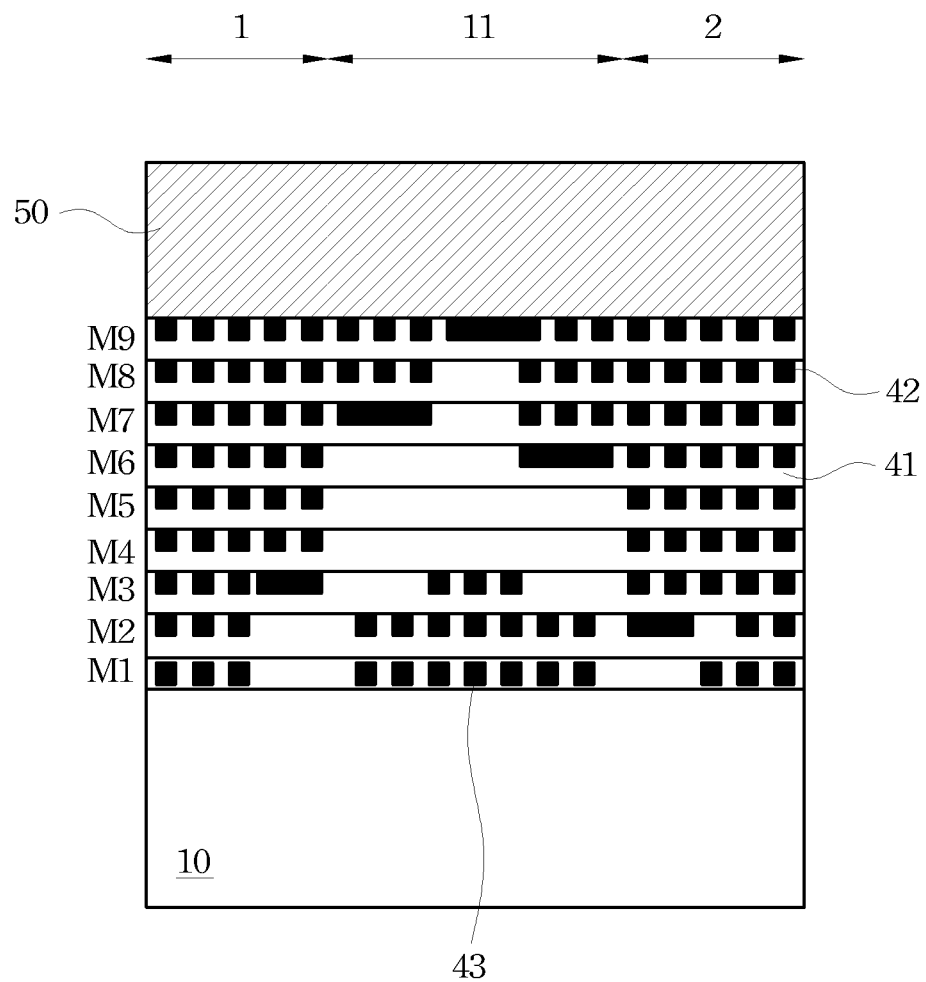

FIG. 8a illustrates a top view of a semiconductor wafer identical to FIG. 7a and illustrates the cutline 8b-8b of the cross-section illustrated in FIGS. 8b and 8c. This embodiment is similar to the prior embodiment except that the multiple metal levels of the alignment marks 21 are formed perpendicular to the dicing street 11. Referring to the cross-sectional view of FIG. 8b, a first alignment mark 21a is disposed in the third metal level, a second alignment mark 21b is disposed in the seventh metal level, a third alignment mark 21c is disposed in the ninth metal level, a fourth alignment mark 21d is disposed in the sixth metal level, and a fifth alignment mark 21e is disposed in the second metal level. As illustrated in FIG. 8b, second metal features 43 are disposed above the alignment marks 21 but not below the alignment marks 21.

FIG. 8c illustrates an alternative embodiment of the alignment mark described in FIG. 8b. As in the prior embodiment described in FIG. 7c, at least some of the lower metal levels underneath some of the alignment marks comprise secondary metal features 43.

Figure 8D:
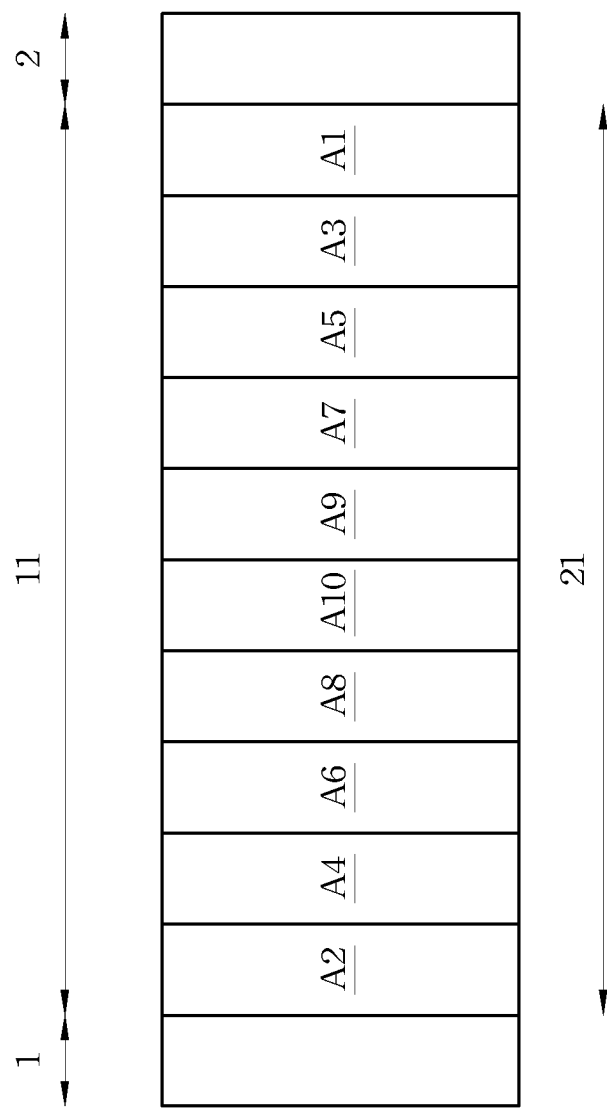

FIG. 8d illustrates a top view of a dicing street comprising alignment marks disposed in multiple metal levels in accordance with an embodiment of the invention. As illustrated in FIG. 8d, the dicing street 11 in a direction perpendicular to the dicing street (along line 8b-8b of FIG. 8a) comprises a first alignment mark A1, a second alignment mark A2, a third alignment mark A3, a fourth alignment mark A4, a fifth alignment mark A5, a sixth alignment mark A6, a seventh alignment mark A7, an eighth alignment mark A8, a ninth alignment mark A9, and a tenth alignment mark A10 disposed in a first metal level, a second metal level, a third metal level, a fourth metal level, a fifth metal level, a sixth metal level, a seventh metal level, an eighth metal level, a ninth metal level, and a tenth metal level respectively. The first, second, third, fourth, fifth, sixth, seventh, eighth, ninth, and tenth alignment marks A1-A10 are formed as in prior embodiments. Hence, the first alignment mark A1 has one of the highest metal density, while the tenth alignment mark A10 has the lowest metal density amongst the alignment marks.

As illustrated in FIG. 8d, the first and the second alignment marks A1 and A2 are disposed along the edges of the dicing street 11, whereas the eighth, the ninth, and the tenth alignment marks A8, A9 and A10 are disposed centrally. Hence, alignment marks with lower density of second metal features 43 are disposed centrally, while alignment marks with higher density of second metal features 43 are disposed along the edges of the dicing street 11.

Figure 9:
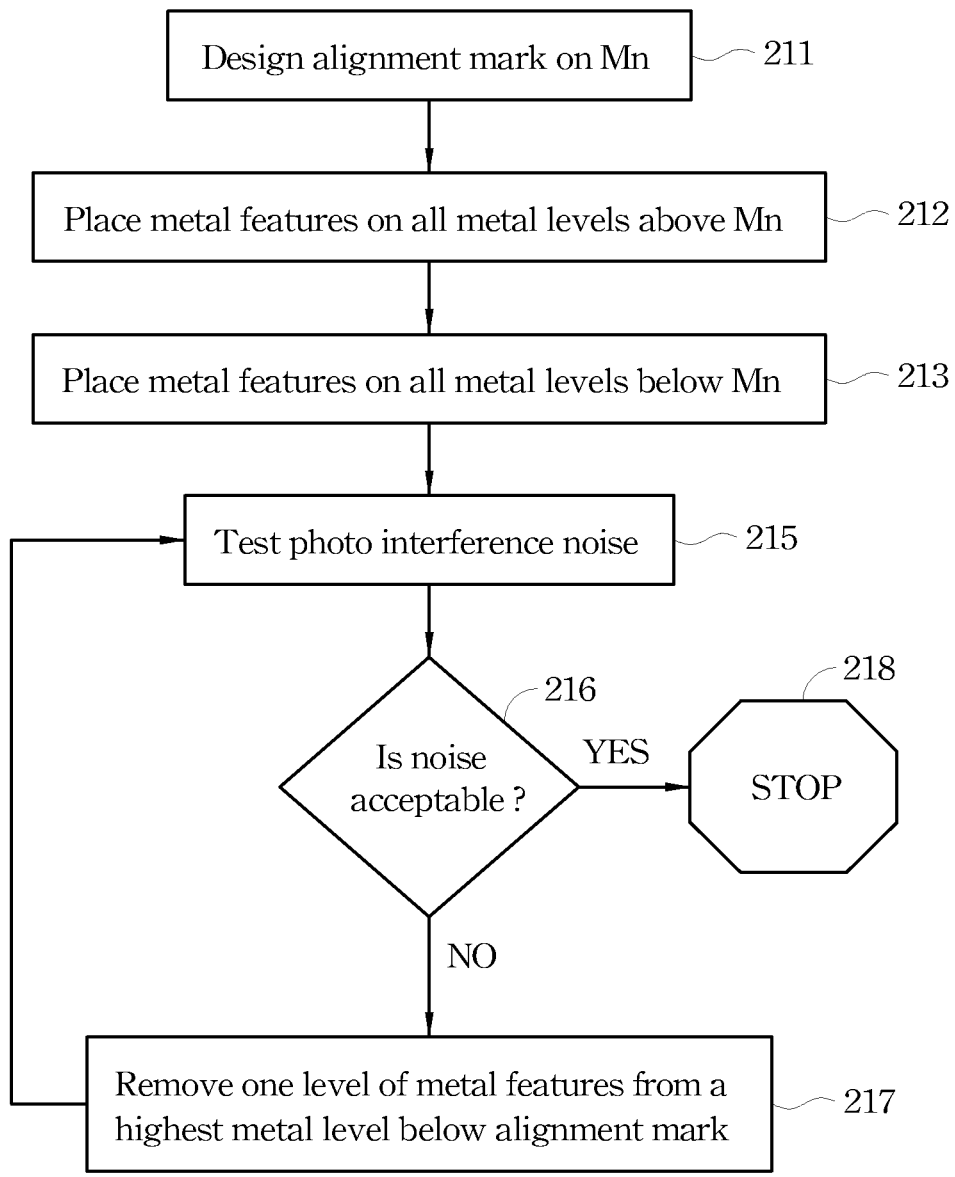
FIG. 9 illustrates a method of designing second metal features below an alignment mark in accordance with embodiments of the invention.
Figure 10A:
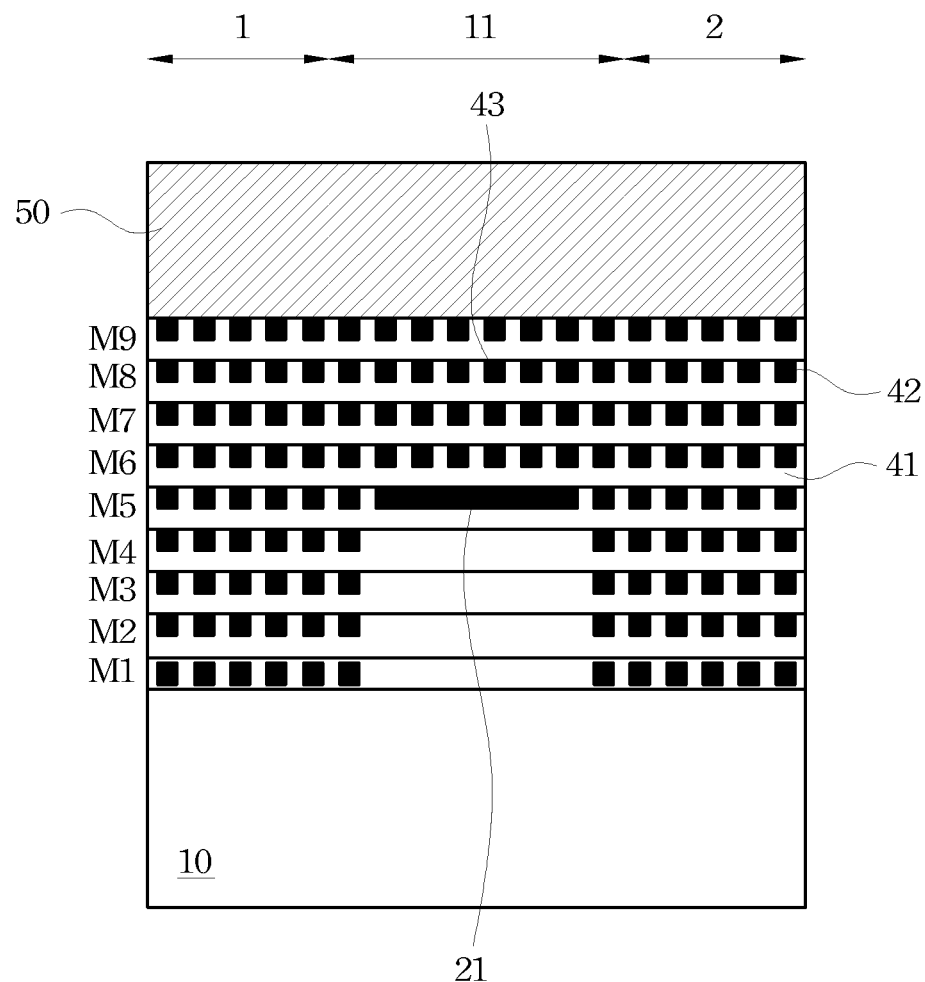
FIGS. 10a-10c, illustrates a cross-sectional view of the dicing street during the design of the dicing street illustrated in FIG. 9, in accordance with embodiments of the invention.
Figure 10B:
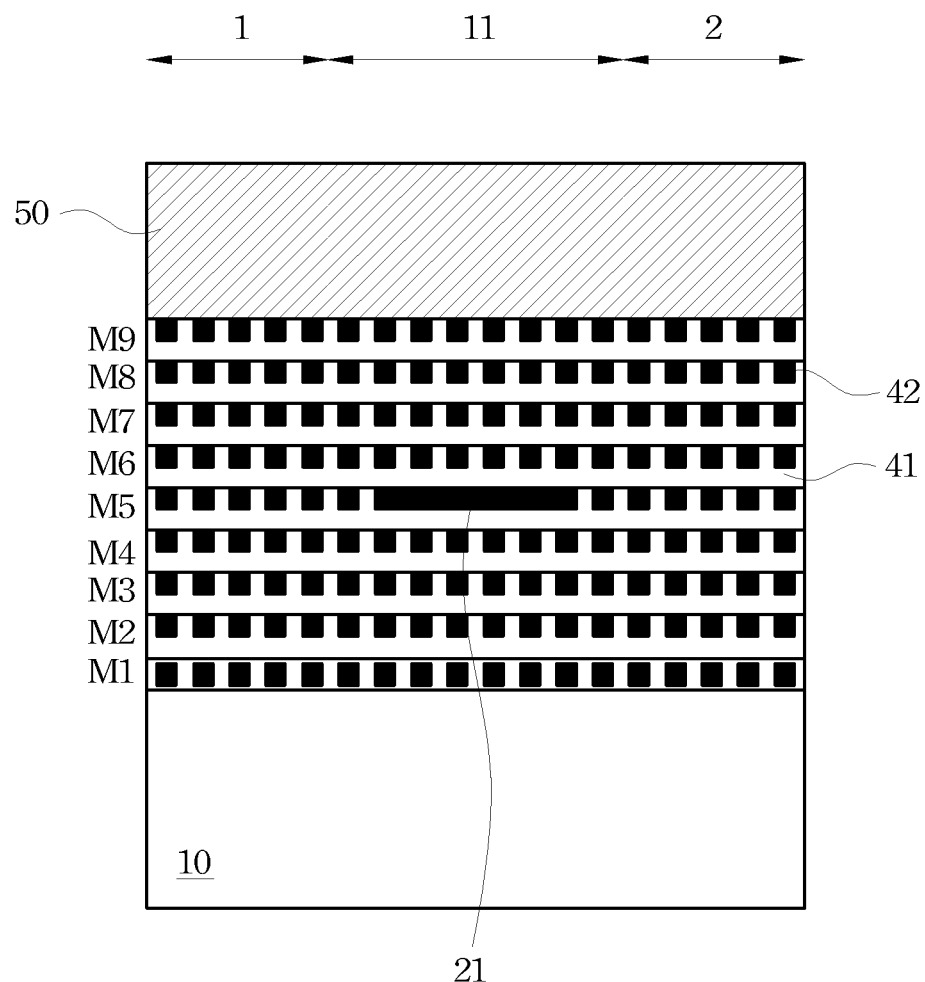
Figure 10C:
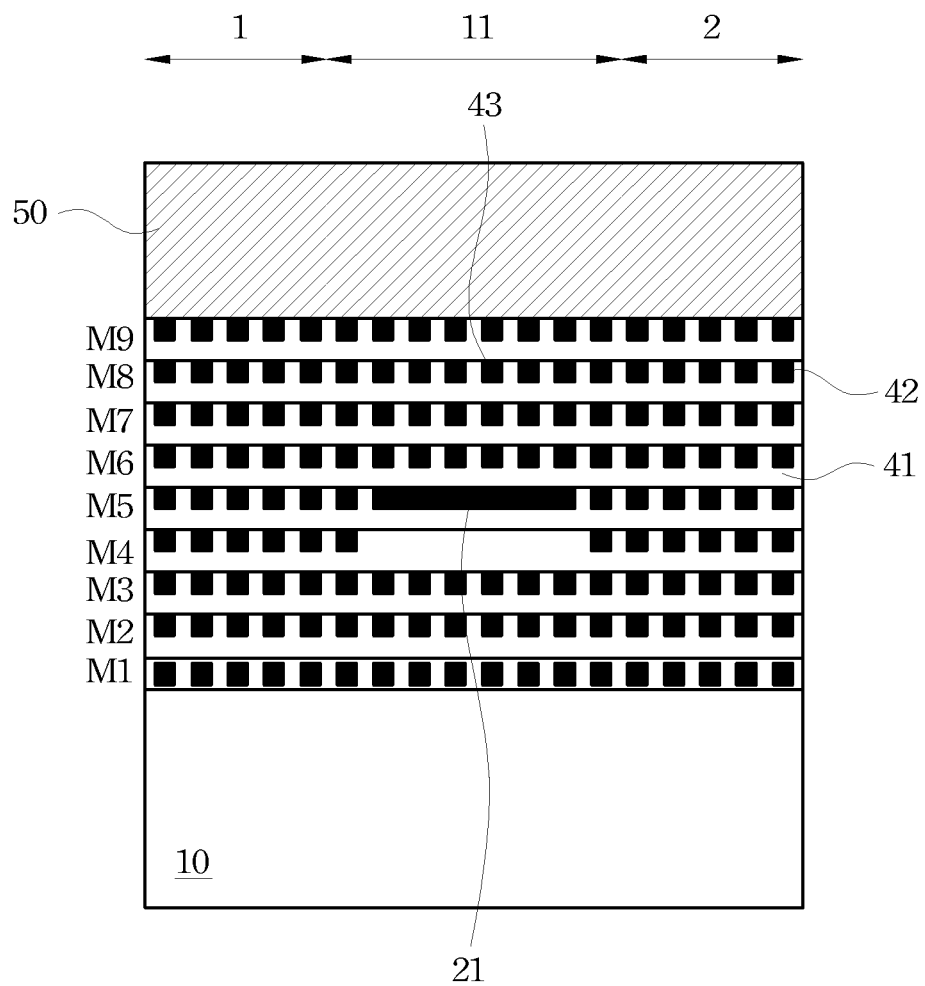

FIG. 9 illustrates a method of designing a dicing street with second metal features in accordance with embodiments of the invention. FIG. 10, which includes FIGS. 10a-10c, illustrates a cross-sectional view of the dicing street during the design process.

Referring to FIG. 9, the alignment mark is designed in an nth metal level Mn (box 211). The secondary metal features are added to all metal levels above nth metal level Mn (box 212). The dicing street 11 after this stage of the design is shown in FIG. 10a. Subsequently, the second metal features 43 are placed on all the metal levels (box 213, FIG. 10b). The interference signal is measured (or simulated) to detect the noise level from the second metal features 43 disposed in the metal levels below the alignment mark (box 215). If the noise level is acceptable, the design is finalized (box 218), if the noise level is unacceptable, secondary metal features 43 from the highest metal level below the alignment mark are removed (box 217). The noise level of the corresponding structure is measured (box 215). This process is iteratively continued until an acceptable noise level is achieved.

In an alternative embodiment, after adding second metal features 43 to all metal levels above the nth metal level Mn (FIG. 10a), secondary features 43 are added to the lowest metal level (e.g., first metal level M1). The noise level of the structure is measured. If the noise level does not exceed an acceptable noise level, secondary metal features 43 are added to the next available lowest metal level (e.g., second metal level M2). If the noise level exceeds the acceptable noise level, secondary metal features 43 are removed from the highest metal level below the alignment mark and the design finalized.

Figure 11A:
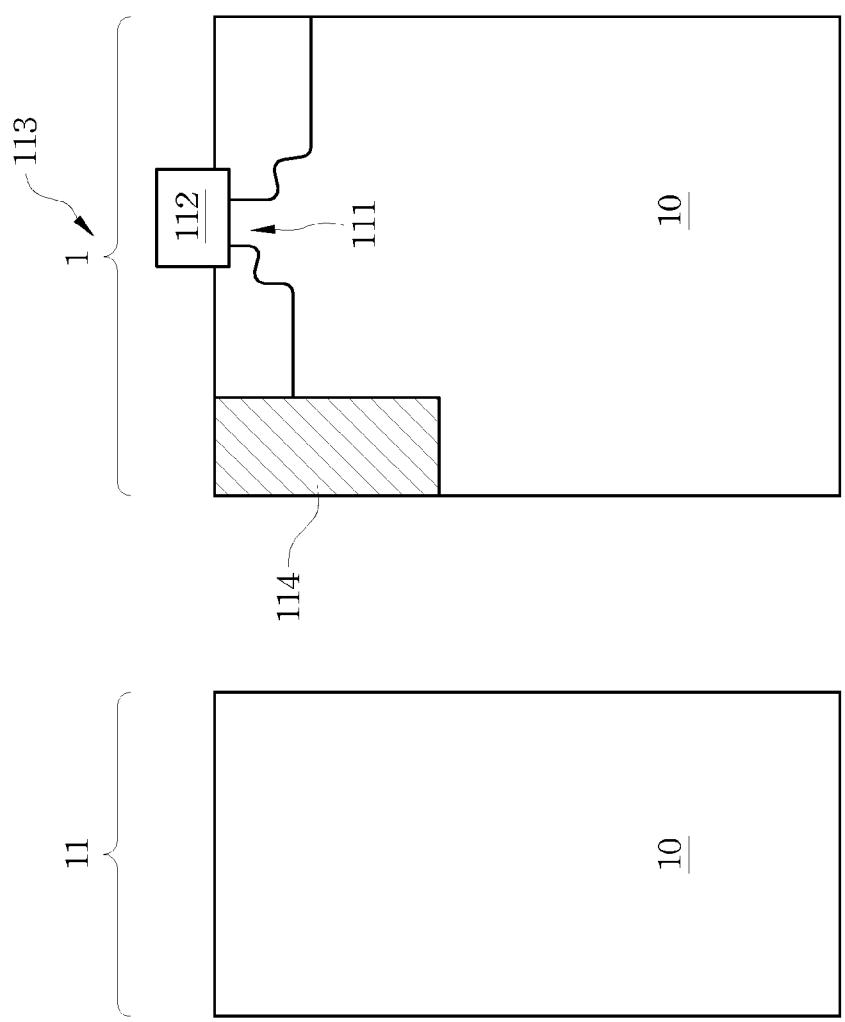
FIGS. 11a-11c, illustrates a method of fabrication of the chips in accordance with an embodiment of the invention.
Figure 11B:
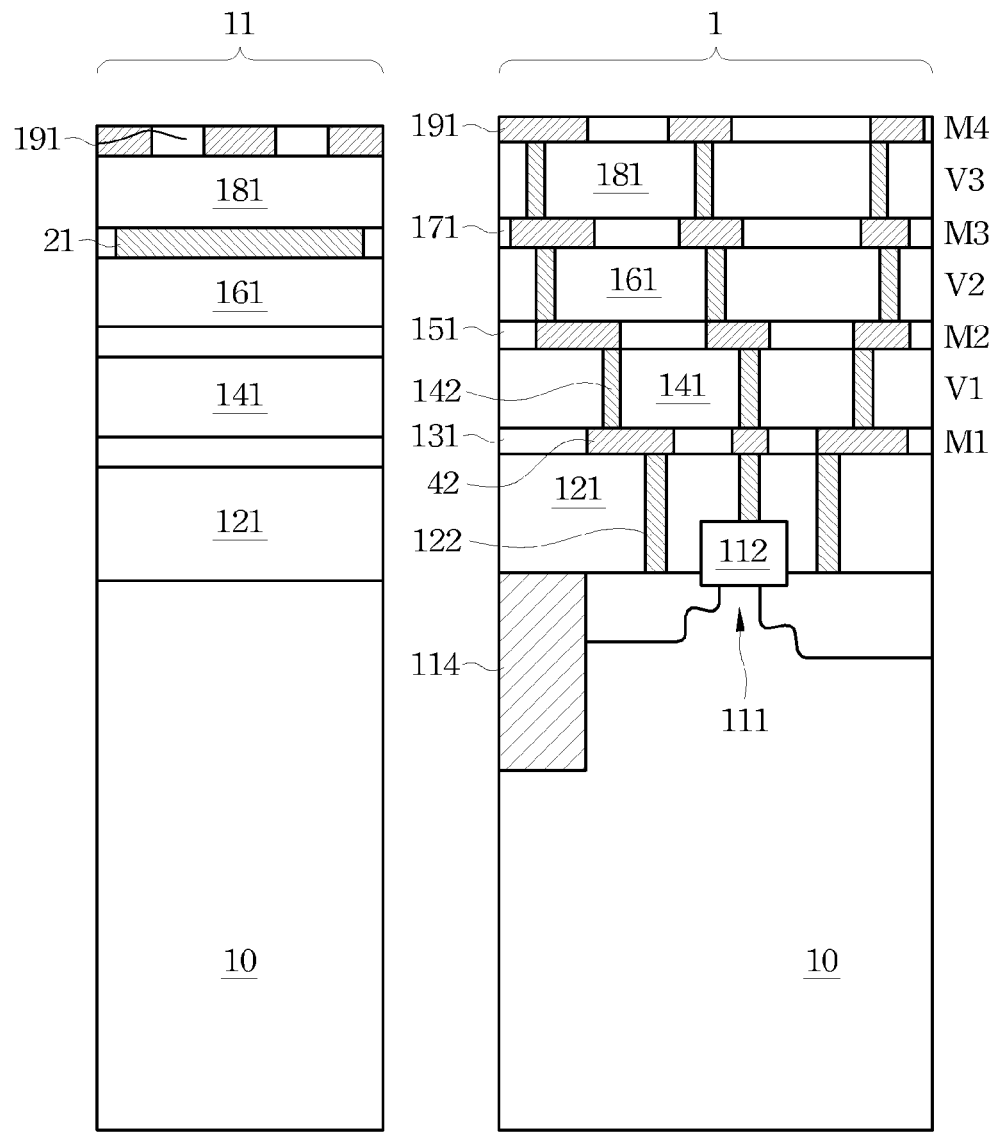
Figure 11C:
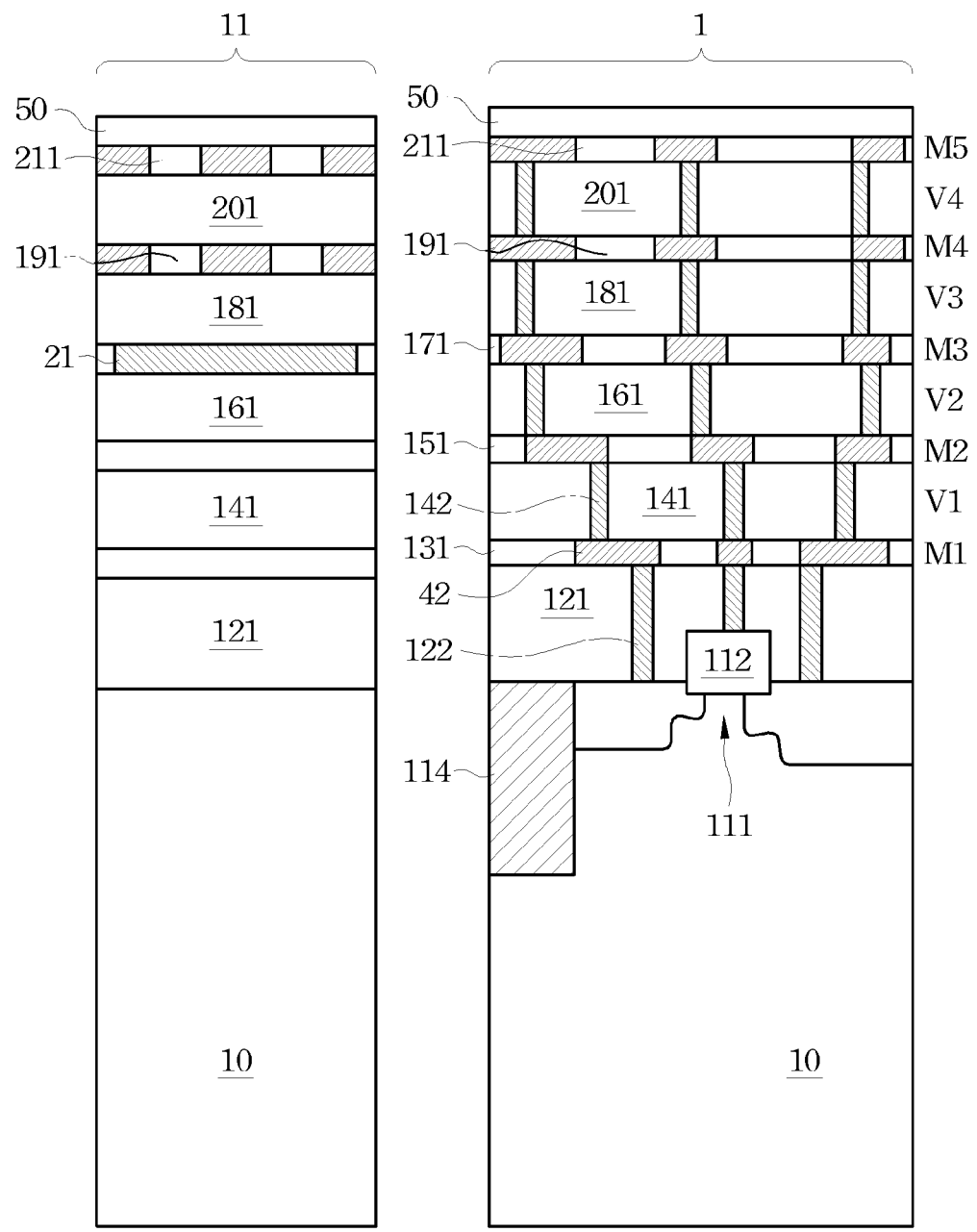

FIG. 11, which includes FIGS. 11a-11c, illustrates a method of fabrication of a substrate the multiple chips in accordance with an embodiment of the invention.

Referring to FIG. 11a, the substrate 10 comprises a first portion for forming a first chip 1, and a second region for forming a dicing street 11. Referring to FIG. 11a, the substrate 10 comprises a bulk mono-crystalline silicon substrate (or a layer grown thereon or otherwise formed therein), a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide or others, can be used with the wafer.

Isolation regions 114 are formed in the substrate 10 using conventional techniques. Referring to FIG. 11a, active device regions 111 are formed in the region for forming the first chip 1 on a top side of a substrate 10 during front end processing. The active device regions 111 or active circuitry can include transistors, resistors, capacitors, inductors or other components used to form integrated circuits. For example, in one embodiment, active areas include transistors 113 (e.g., CMOS transistors) comprising gate lines 112, and separated from one another by isolation regions 114, e.g., shallow trench isolation. In an alternative embodiment, the active device regions 111 comprise bipolar transistors.

Referring now to FIG. 11b, a first insulating material layer 121 is formed over the substrate 10. An etch stop liner is optionally deposited over the substrate 10 before depositing the first insulating material layer 121 to also protect the underlying substrate during contact plug formation. For example, a nitride film (e.g., silicon nitride) is deposited as an etch stop liner.

The first insulating material layer 121 comprises insulating materials typically used in semiconductor manufacturing for inter-level dielectric (ILD) layers, such as SiO2, tetra ethyl oxysilane (TEOS), fluorinated TEOS (FTEOS), doped glass (BPSG, PSG, BSG), organo silicate glass (OSG), fluorinated silicate glass (FSG), and spin-on glass (SOG), SiN, SiON. The insulating material layer 121 may also comprise suitable low-k or ultra-low-k (ULK) materials. The first insulating material layer 121 may comprise a thickness of about 500 nm or less in one embodiment.

Contact plugs 122 are formed within the insulating material layer 121 for coupling the transistor 113 to other devices or external contacts. A second insulating material layer 131 is then deposited over the first insulating material layer 121. The second insulating material layer 131 comprises a low-k dielectric material having a dielectric constant of 3.6 or less, and may require heating, e.g., up to 400 degrees C. to remove solvents. The second insulating material layer 131 is patterned via lithography, e.g., with a mask. A photoresist is deposited over the second insulating material layer 131, and portions of the photoresist are exposed, developed and removed, leaving a pattern for a metal line. The exposed second insulating material layer 131 is removed to form an opening in the second insulating material layer 131.

The opening is filled with a conductive material, for example, using an electroplated fill process to form a first metal level (M1) having a portion residing within the second insulating material layer 131 and a portion residing over the first insulating material layer 121. First metal features 42 are formed in the first metal line level (M1) by filling the openings in the second insulating material layer 131. Based on the design of the dicing street region (for example, as described in FIG. 9), second metal features 43 may also be formed in the first metal line level (M1) by filling the openings in the second insulating material layer 131. In particular, the first metal features 42 are formed in the chip 1 region, whereas second metal features 43 are formed in the dicing street 11 region. In various embodiments, the conductive material comprises copper, aluminum or other metals or combinations thereof.

Before depositing the conductive material, a conductive liner is optionally deposited using a conformal deposition process, leaving a conformal liner or diffusion barrier along the interior walls of the opening of second insulating material layer 131. In one embodiment, the conductive liner comprises tantalum nitride deposited by plasma vapor deposition (PVD). Alternatively, the conductive liner may comprise titanium nitride, tungsten nitride, a refractory metal or other barrier layers that may be conformally deposited, for example, using CVD, PVD processes or electro-less plating. The conductive liner may comprise a bi-layer of material, including, for example, a barrier layer and a conformal seed layer, which comprises copper, aluminum, other metals or combinations thereof. The seed layer may be deposited using a CVD process, for example.

A third insulating material layer 141 is deposited over the second insulating material layer 131. The third insulating material layer 141 in the first chip 1 region is patterned and etched to create via holes. In some embodiments, the third insulating material layer 141 in the dicing street 11 region is not patterned to form via holes. The via holes formed in the first chip region 1 are filled with another conductive material such as copper to form first via level (V1) comprising vias 142.

Similarly, more metal levels and via levels are formed above the first via level (V1) by repeating the process for formation of metal lines and vias. For example, in FIG. 11b, fourth, fifth, sixth, seventh, and eighth insulating material layers 151, 161, 171, 181, and 191 comprising second metal level (M2), second via level (V2), third metal level (M3), third via level (V3), and fourth metal level (M4) are formed.

As illustrated in FIG. 11b, the alignment mark 21 is formed in one of the metal levels. In one embodiment, the alignment mark 21 is formed in the third metal level. Hence, no second metal features 43 are formed in the second metal level M2 of the dicing street, whereas the fourth metal level M4 comprises second metal features 43.

As next illustrated in FIG. 11c, subsequent metal levels are formed. For example, top metal level M5 is formed in a tenth insulating material layer 211 disposed over a ninth insulating layer 201. A passivation layer 50 is deposited over the last metal line (top metal level M5). The passivation layer 50 comprises an oxide layer or an oxide/nitride layer stack. In some embodiments, the passivation layer 50 comprises silicon nitride, or silicon oxynitride, FTEOS, SiCOH, or combinations thereof with polyimide, photoimide, BCB or other organic polymers.

After all front end and back end processing, the substrate 10 is mounted on a dicing tape or a holder for support during subsequent dicing. A dicer (not shown) is aligned using alignment mark 21 to the dicing street 11. As the second metal features 43 are not formed under the alignment marks 21, minimal noise is generated, minimizing alignment errors. The presence of second metal features 43 above the alignment marks 21 reduces crack initiation. The dicer cuts through the BEOL layers 20 and the substrate 10. Individual dies are generated after the dicing process. In various embodiments, dicing is performed by mechanical sawing, by scribing and then breaking or by laser cutting. The die is extracted by die handling equipment from the dicing tape, like a die bonder or die sorter, forming individual chips.

Following the dicing process, the individual chips are encapsulated into packages which are then suitable for use in building electronic devices such as computers, etc. The chips are integrated into a lead-frame package or placed directly on a PC board substrate or packaged using solder bumping technologies.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   forming a dicing street and cell regions, the cell regions comprising active devices in a substrate, and the dicing street separating the cell regions;

forming a plurality of first metal features in a first metal level in a first dielectric layer above a first portion of the dicing street;

forming a first alignment mark and a plurality of second metal features disposed in a second metal level in a second dielectric layer above the first metal level and a first portion of the dicing street, an uppermost surface of the first alignment mark being substantially level with an uppermost surface of the second dielectric layer, the first alignment mark comprising a first continuous metal feature, wherein the first continuous metal feature has a substantially flat uppermost surface extending contiguously between the lateral boundaries of the first continuous metal feature, wherein no metal features are disposed within lateral boundaries of the first continuous metal feature between the first continuous metal feature and the substrate; and forming a plurality of third metal features in a third metal level in a third dielectric layer above the second metal level, wherein a portion of each of at least two of the plurality of third metal features are aligned over and within the lateral boundaries of the first continuous metal feature, wherein the plurality of third metal features are laterally separated by first distances and disposed in a plurality of rows forming a plurality of fourth metal features in a fourth metal level in a fourth dielectric layer, the fourth dielectric layer extending contiguously from an uppermost surface to a bottommost surface of the fourth metal level, the fourth dielectric layer having a bottommost surface in direct physical contact with an uppermost surface of the third dielectric layer, wherein a portion of each of the plurality of fourth metal features are aligned directly over and within the lateral boundaries of the first continuous metal feature.

2. The method of claim 1, further comprising:
before forming the first metal level, forming a fifth level disposed over the substrate, the fifth level comprising no metal features above the first portion of the dicing street.

3. The method of claim 1, further comprising:
forming a fifth level disposed above the fourth metal level, the fifth level comprising no metal features above a second portion of the dicing street; and
forming a sixth metal level disposed over the fifth level, the sixth metal level comprising a second alignment mark above the second portion of the dicing street;
forming a seventh metal level disposed over the sixth metal level, the seventh metal level comprising fifth metal features above the second portion of the dicing street;
forming an eighth level disposed over the seventh metal level, the eighth level comprising no metal features above a third portion of the dicing street; and
forming a ninth metal level disposed over the eighth level, the ninth metal level comprising a third alignment mark above the third portion of the dicing street.

4. The method of claim 3, wherein forming the second metal level disposed over the substrate comprises forming sixth metal features disposed in the second metal level above the third portion of the dicing street.

5. The method of claim 3, wherein the first portion of the dicing street is closer to an edge of the dicing street than the second portion of the dicing street, and wherein the second portion of the dicing street is closer to an edge of the dicing street than the third portion of the dicing street.

6. The method of claim 1, wherein a portion of each of at least two of the plurality of third metal features are aligned over and within the lateral boundaries of one of the second metal features.

7. The method of claim 1, wherein the plurality of third metal features comprise rectangular metal lines.

8. A method of fabricating a semiconductor device, the method comprising:
fabricating on a substrate a plurality of die regions separated by scribe regions;
depositing a first dielectric layer over the die regions and over the scribe regions;
embedding an alignment mark in the first dielectric layer and simultaneously embedding first interconnects in the first dielectric layer over the die regions, the alignment mark having a substantially flat uppermost surface extending contiguously between lateral boundaries of the alignment mark, the uppermost surface of the alignment mark being substantially level with an uppermost surface of the first dielectric layer;
depositing a second dielectric layer over the alignment mark and the first interconnects;
embedding second interconnects in the second dielectric layer, the second interconnects being laterally separated by first distances and a portion of each of at least two of the second interconnects aligned over and within the lateral boundaries of the alignment mark, the plurality of the second interconnects disposed in a plurality of rows; and
depositing a contiguous third dielectric layer over the second interconnects, the third dielectric layer having a bottommost surface in direct physical contact with an uppermost surface of the second dielectric layer; and
embedding third interconnects in the third dielectric layer forming a third metal level in the third dielectric layer, wherein a portion of each of the third interconnects is aligned directly over and within lateral boundaries of the alignment mark.

9. The method of claim 8, wherein the alignment mark, the first interconnects, the second interconnects, and the third interconnects are respectively embedded using a damascene process.

10. The method of claim 8, further comprising forming fourth interconnect structures underlying the first dielectric layer.

11. The method of claim 10, wherein the fourth interconnect structures include metal features overlying the die regions and no metal features underlying the alignment mark.

12. The method of claim 8, further comprising forming a second alignment mark in the first dielectric layer, the second alignment mark being further from an edge of a scribe region than the alignment mark.

13. The method of claim 8, further comprising placing the second interconnects in rows, each row aligned in a first direction, each row adjacent to at least one other row in a second direction different from the first direction, each row having two or more second interconnects disposed therein and separated in the first direction by first distances.

14. The method of claim 8, further comprising electrically coupling selected ones of the first interconnects to selected ones of the second interconnects.

15. The method of claim 8 wherein each die region of the plurality of die regions has at least two scribe regions separating it from another die region of the plurality of die regions and further comprising forming at least one alignment mark in each of the two scribe regions.

16. The method of claim 8, wherein multiple interconnect levels are formed below the alignment mark and wherein one interconnect level of the multiple interconnect levels most adjacent to the alignment mark has no metal features aligned with the alignment mark.

17. A method of fabricating a semiconductor device, the method comprising:
    forming a dicing street and cell regions, the cell regions comprising active devices in a substrate, and the dicing street separating the cell regions;
    forming first trenches in a first dielectric layer disposed above a first portion of the dicing street and forming in the respective first trenches a plurality of first metal features above the first portion of the dicing street;
    forming a second trench in a second dielectric layer above the first dielectric layer and a first portion of the dicing street, and forming in the second trench an alignment mark, an uppermost surface of the alignment mark being substantially level with an uppermost surface of the second dielectric layer, wherein the alignment mark has a substantially flat uppermost surface extending contiguously between the lateral boundaries of the alignment mark, wherein no metal features are disposed within lateral boundaries of the alignment mark between the alignment mark and the substrate;
    forming third trenches in a third dielectric layer disposed above the second dielectric layer and forming in the respective third trenches a plurality of third metal features above the first portion of the dicing street, wherein the alignment mark completely overlaps at least two of the plurality of third metal features in a plan view, wherein adjacent ones of the plurality of third metal features are laterally separated by a first distance and disposed in a plurality of rows; and
    forming fourth trenches in a fourth dielectric layer disposed above the third dielectric layer and forming in the respective fourth trenches a plurality of fourth metal features above the first portion of the dicing street, the fourth dielectric layer formed of a contiguous material extending from an uppermost surface of the fourth dielectric layer to a bottommost surface of the fourth dielectric layer, wherein the alignment mark completely overlaps each of the plurality of fourth metal features in the plan view, wherein the bottommost surface of the fourth dielectric layer is in direct physical contact with the uppermost surface of the third dielectric layer.

18. The method of claim 17, wherein the plurality of third metal features comprise rectangular metal lines.

19. The method of claim 17, wherein the plurality of third metal features include at least one rectangular line located along a periphery of the dicing street.

20. The method of claim 17, wherein the plurality of third metal features include at least one rectangular line located along a center portion of the dicing street.

\* \* \* \* \*